United States Patent
Pittaluga et al.

(10) Patent No.: US 7,504,825 B2
(45) Date of Patent: Mar. 17, 2009

(54) METHOD AND PROBE FOR COMPENSATING FOR MAGNETIC NOISE FIELDS IN SPACE VOLUMES, PARTICULARLY IN MAGNETIC RESONANCE IMAGING APPARATUS

(75) Inventors: Stefano Pittaluga, Genoa (IT); Paolo Iaia, Genoa (IT)

(73) Assignee: Esaote S.p.A., Casale Monferrato (IT)

( * ) Notice: Subject to any disclaimer, the term of this patent is extended or adjusted under 35 U.S.C. 154(b) by 0 days.

(21) Appl. No.: 11/197,341

(22) Filed: Aug. 5, 2005

(65) Prior Publication Data
US 2006/0038562 A1 Feb. 23, 2006

(30) Foreign Application Priority Data
Aug. 5, 2004 (IT) .................... SV2004A0032

(51) Int. Cl.
*G01V 3/00* (2006.01)
(52) U.S. Cl. .................... 324/318; 324/320
(58) Field of Classification Search ........... 324/318, 324/320
See application file for complete search history.

(56) References Cited

U.S. PATENT DOCUMENTS

| | | | | |
|---|---|---|---|---|
| 4,996,484 A | * | 2/1991 | Spies | 324/334 |
| 5,245,286 A | * | 9/1993 | Carlson et al. | 324/319 |
| 6,462,540 B1 | * | 10/2002 | Kandori et al. | 324/248 |
| 6,844,732 B2 | * | 1/2005 | Carlini et al. | 324/318 |
| 2002/0195977 A1 | | 12/2002 | Takao Goto | |

FOREIGN PATENT DOCUMENTS

| | | |
|---|---|---|
| DE | 197 02 831 A1 | 3/1998 |
| EP | 1 353 192 A2 | 10/2003 |
| EP | 1 460 443 A2 | 9/2004 |
| JP | 7-079951 A | 3/1995 |

OTHER PUBLICATIONS

European Search Report dated Mar. 21, 2005.

* cited by examiner

*Primary Examiner*—Louis M Arana
(74) *Attorney, Agent, or Firm*—Buchanan Ingersoll & Rooney PC

(57) ABSTRACT

A method for compensating in a space volume for a magnetic noise field outside the space volume includes determining a strength of the magnetic noise field outside the space volume; defining a correlation between the noise field outside the space volume and a corresponding noise field inside the space volume, or calculating the noise field inside the space volume on the basis of the measurements of the magnetic field outside the space volume; based on the noise field inside the space volume, generating a magnetic compensation field for neutralizing the noise field inside the space volume; wherein the compensation of the magnetic noise field outside the space volume is carried out along a direction in the space volume which is variable by determining a noise field component inside the space volume along the direction and generating a compensation field of the noise field component along the direction.

78 Claims, 5 Drawing Sheets

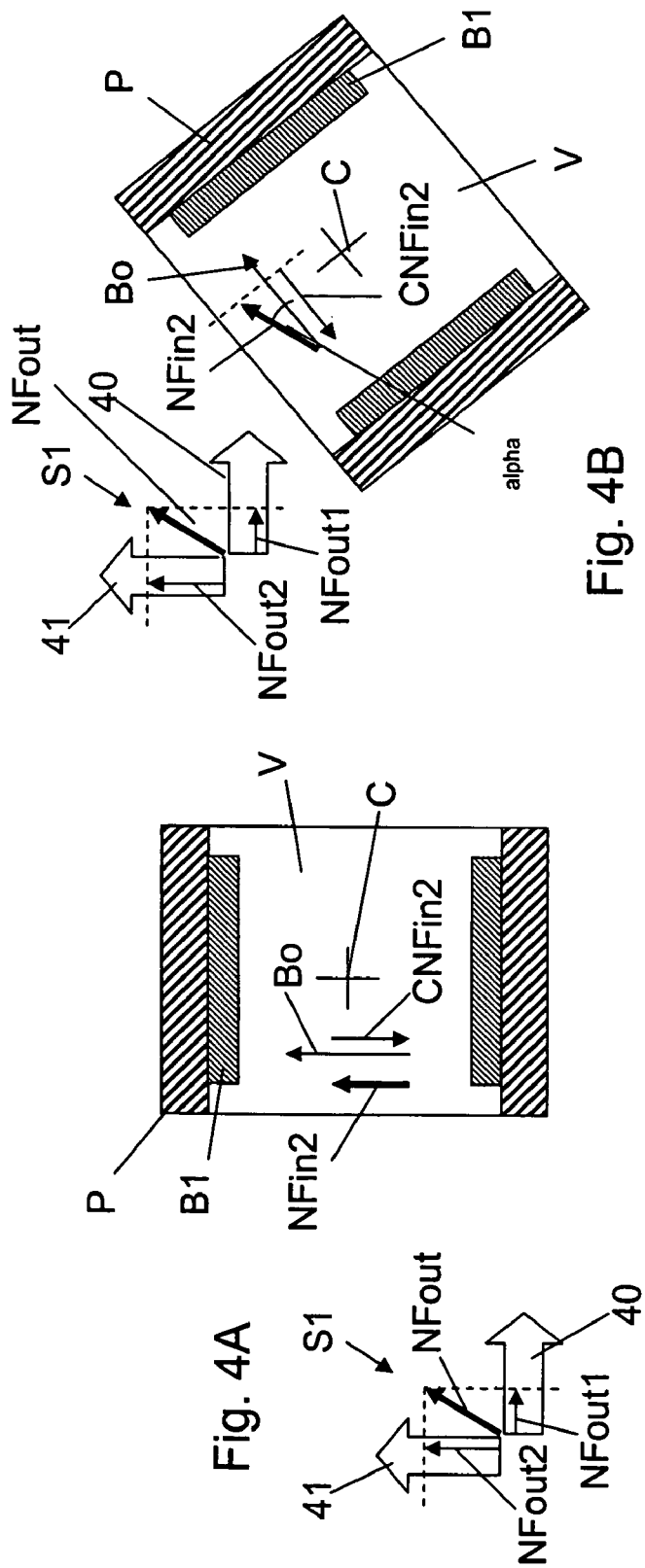
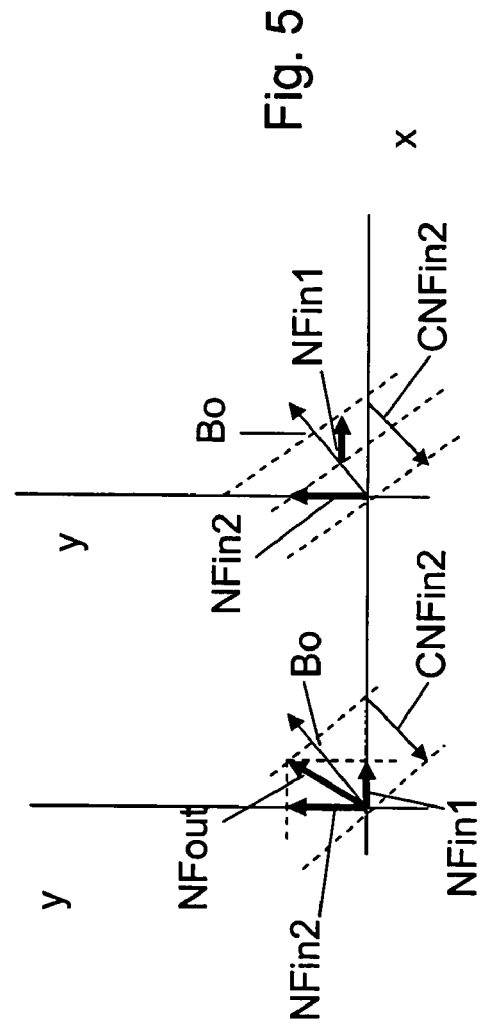
Fig. 4A
Fig. 4B
Fig. 5

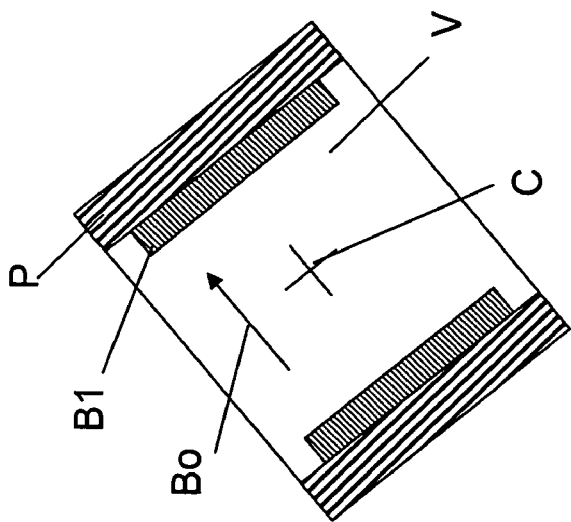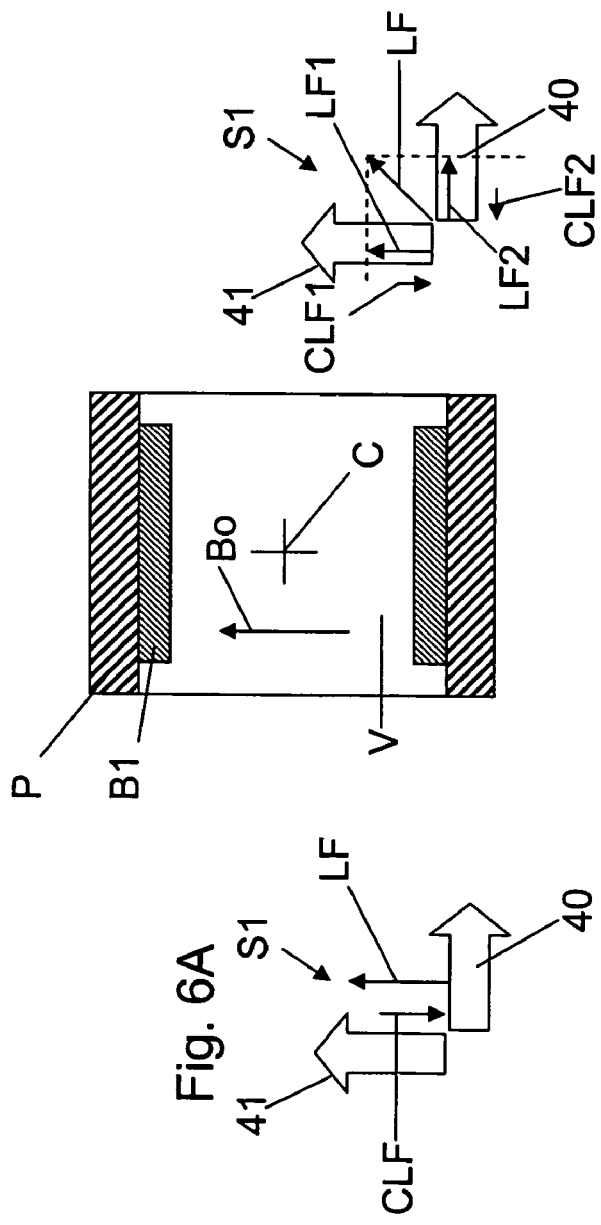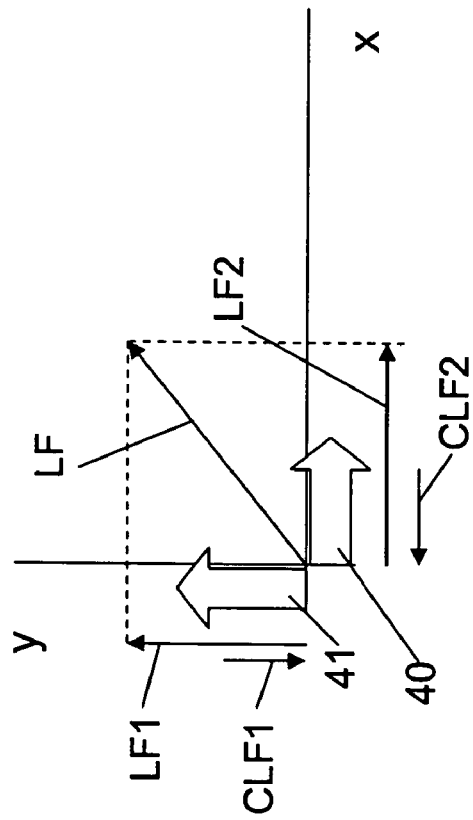

METHOD AND PROBE FOR COMPENSATING FOR MAGNETIC NOISE FIELDS IN SPACE VOLUMES, PARTICULARLY IN MAGNETIC RESONANCE IMAGING APPARATUS

CROSS-REFERENCE TO RELATED APPLICATIONS

The present application claims the priority of Italian Patent Application Number SV2004A000032, filed on Aug. 5, 2004, the entire content of which is hereby incorporated herein by reference.

FIELD OF THE INVENTION

The invention relates to a method for compensating magnetic noise fields in space volumes, which space volumes are permeated by a magnetic field having a predetermined strength value.

DESCRIPTION OF RELATED ART

In the following description and claims, "noise fields" shall be intended as magnetic field fluctuations induced in a space volume, particularly the imaging cavity and volume of Magnetic Resonance imaging apparatuses, which fluctuations are caused by magnetic fields outside the space volume or the imaging cavity of the MRI apparatus.

Currently, the wide use of electric power causes the generation of considerable magnetic fields, which pervade the environment. These magnetic fields may have considerable strengths and affect or alter the operation of electric or electronic equipment which use magnetic fields. Such equipment may be of any type, e.g., measuring instruments, diagnostic or therapeutic imaging apparatuses, and the like.

Currently, the above noise may be caused by two types of magnetic fields, which are differentiated on the basis of frequency. A first so-called low-frequency type includes magnetic fields with frequencies ranging from less than 1 Hz to a few units of Hz. These types of low-frequency noise fields are typically generated by the passage of vehicles or the like. Each vehicle generates, in first approximation, a magnetic dipole with a predetermined strength and a predetermined position and the dipoles are oriented in the direction of the earth's magnetic field flow lines.

A second type includes noise fields generated by sources of mains AC, which have frequencies of about 50 to 60 Hz. Besides home or static sources, electric vehicles shall be also considered, such as trains, tramcars, subway trains, trolleybuses, etc., due to the considerable powers absorbed and the strengths of the fields generated thereby.

A third group might include noise fields with frequencies of the order of a fraction of the mains frequency, i.e., of about 10 to 20 Hz. Particularly, some railway electrification lines use, for instance, one-third of the mains frequency, that is a frequency of the order of 16 Hz.

Other noise fields consist of fast, i.e., high-frequency transients. In space volumes containing significant electrically conductive masses, e.g., magnet structures of Magnetic Resonance Imaging apparatuses or shielding Faraday cages, particularly of such Magnetic Resonance Imaging apparatuses, these fast transient induce noise currents, modify the noise fields inside the imaging cavity. These fast magnetic field transients may be also combined with other noise types.

A method as described hereinbefore is known from patent application EP 1 353 192 by the applicant hereof. Currently, prior art methods of compensation for magnetic fields like the ones described hereinbefore use at least one magnetic field probe which has to be placed outside the space volume. This is necessary because, particularly in a MRI apparatus, the magnetic field within the space volume, which is generated by the magnet structure of the MRI apparatus, has such a strength as to cause probe saturation, whereby probe or probes could not measure the noise fields generated outside the MRI apparatus or the space volume, i.e., outside the patient receiving cavity or the imaging volume.

Therefore, noise field probes shall be placed at such distances from the space volume in which noise field compensation is desired, that the strength of the magnetic field inside the space volume is sufficiently low to allow measurement of outside noise fields. In these conditions, the calculation or determination of noise fields in the space volume are relatively complex and actually inaccurate.

Particularly in Magnetic Resonance Imaging apparatuses, there has to be such a distance between the probes and the magnet structure that generates the patient cavity and imaging volume permeating magnetic field that the probes shall be placed outside the apparatus installation room. For instance, when a chamber-like Faraday cage is provided, or when the Faraday cage is the MRI apparatus installation room itself, suitably having shielded walls, the probes shall be placed outside the Faraday cage, whereby they do not consider the shielding effect of the cage and the calculation or empiric determination of noise fields in the imaging volume of the MRI apparatus is even more complex and difficult, therefore more inaccurate.

Currently MRI apparati are known in which the magnetic structure of the scanner is displaceable in space, particularly in such a way as to determine a different orientation of the static magnetic field generated in the cavity of the MRI apparatus by the magnetic structure. Typically this variations in the orientation of the static magnetic field is caused by a rotation of the magnetic structure. MRI scanners which have a rotatable magnetic structure are known, for example from EP 1 460 443 of the same applicant.

Rotation of the magnet has two main effects. A first effect is that the effect of the static magnetic field on the probe is variable as a function of the rotation of the magnetic structure. This means that the effect of the static magnetic field on the probe is variable as a function of the difference in orientation of the probe and of the static magnetic field. So this effect mainly attains to the compensation of the saturation of the probe due to the static magnetic field of the magnetic structure of the MRI scanner.

A second effect attains to the compensation of the noise fields in the space volume which consist in the cavity enclosed by the magnetic structure and permeated by the static magnetic field. In this case the effect of the noise fields on the static magnetic field in the cavity of the magnetic structure of the MRI apparatus depends on the rotation angle of the magnetic structure. Noise fields have typical field orientation in space so that a rotation of the magnetic structure causes the orientation of the static magnetic field relatively to the one of the noise fields to change as a function of the rotation.

Ignoring this phenomena would lead in a non correct reduction of the saturation of the probe and also to a non correct compensation of the effects of the noise fields in the space volume which is represented by the cavity of the MRI scanner defined by the magnetic structure.

The case of the rotatable magnetic structure of an MRI apparatus is a special example of the general case in which the effects of the noise fields has to be considered in relation to a reference direction in space which is variable and particularly where the effects of the noise fields on magnetic field permeating the space volume has to be considered which magnetic fields has a variable direction in space.

In order to clearly understand the problem it has to be stressed out the magnetic field probes are directional and measures the component of the magnetic field which is oriented parallel to their direction of measurement. So if the field is not oriented in a parallel direction to the direction of measurement of the probe, then only the component of the field in the direction of measurement of the probe is measured.

This applies similarly to the effects of the noise fields to be compensated on a magnetic field which is present or is generated inside a space volume and which field has a predetermined direction. Since the effects can be described as a vector addition only the components of the noise fields having the same direction as the magnetic field in the space volume will contribute to vary the strength of the field in the direction of the magnetic field.

OBJECTS AND SUMMARY

The invention has the purpose of improving prior art methods to obtain a better and more accurate noise field compensation.

An embodiment of the invention achieves the above purposes by a method which includes the step of generating, at least at some or at each of the noise field detection locations, a local magnetic field for at least partly compensating for the strength of the magnetic field existing or generated in the space volume.

This arrangement allows to partly compensate for the condition of saturation of a noise field probe by the magnetic field existing in the space volume. Therefore, the probe and the noise field detection locations may be closer to the space volume. In a MRI apparatus, this means that the probes may be closer to the magnet structure of the MRI apparatus and to the patient cavity and to the imaging volume. By at least partly compensating, at probe locations, for the static magnetic field induced by the magnet structures of such apparatuses on noise field probes, the saturation effect on such probes may be reduced, and probes may be restored to an operating condition, in which the strength of noise fields generated outside the MRI apparatus may be measured.

According to a further characteristic, the compensation for the probe saturation effect caused by the predetermined in-volume magnetic field, i.e., in the imaging volume or cavity defined by the magnet structure of a MRI apparatus, is set to such a value that the compensation field allows compensates for 50% of such effect, thereby allowing to place the probes, hence the noise field detection locations, at about 50% of the distance that was initially required to prevent probe saturation, with no compensation therefore being provided.

Typical field values for a MRI apparatus are, for instance 0.18 Tesla or 0.24 Tesla. When no compensation is provided for the predetermined magnetic field effect leading to probe saturation, the probe should be placed at a distance of about 2 meters in the former case, and about 4 meters in the latter case, from the magnet structure of the MRI apparatus, to prevent saturation. These distances are relatively important and probes are unavoidably located outside the shielding chambers of MRI apparatuses or outside appropriately shielded rooms.

By having the noise field probes closer to the magnet structure or the space volume in which a predetermined magnetic field exists, the rules of correlation between the noise fields detected outside the space volume and the corresponding noise fields inside the space volume, which rules are different for each of the at least two, three or more frequency bands provided for discriminating the different types of noise fields, or are different for at least some of the at least two, three or more discriminating frequency bands may be defined more accurately or with a lower margin of error.

Magnetic fields designed to compensate for the effect of the predetermined in-volume magnetic field at noise field detection locations may be generated by permanent magnets or resistive magnets, which are located at the probe or noise field detection locations and/or are even integrated in the probes.

When the magnetic field existing or generated in the space volume has a variable orientation in space, the method according to the present invention provides the step of varying correspondingly the orientation in space of the probe or of the probes.

More in detail the present method provides for the steps of generating a magnetic field inside a space volume which magnetic field has a first predefined orientation in space;

Providing a probe for measuring the magnetic noise fields components along a first measuring direction of the probe which is parallel or has a predetermined direction relatively to the first direction of the magnetic field inside the space volume;

Determining the strength of the magnetic field outside the space volume along the measuring direction of the probe;

defining, on a theoretical basis, i.e., according to the laws of electromagnetism, or on an empirical basis, the correlation between the noise field outside the space volume and the corresponding noise field inside the space volume, or calculating the noise field inside the space volume, on the basis of the measurements of the magnetic field outside the space volume;

Generating the magnetic compensation field inside the space volume which is the inverse field of the components of the noise fields inside the space volume along the first direction of the magnetic field in the space volume;

Varying for the same angular displacement the direction of the magnetic field in the space volume, the direction of the magnetic compensation field inside the space volume and the direction of measurement of the probe from the first directions into a second direction;

Determining the strength of the magnetic field outside the space volume along the second measuring direction of the probe;

defining, on a theoretical basis, i.e., according to the laws of electromagnetism, or on an empirical basis, the correlation between the noise field outside the space volume and the corresponding noise field inside the space volume, or calculating the noise field inside the space volume, on the basis of the measurements of the magnetic field outside the space volume;

Generating the magnetic compensation field inside the space volume which is the inverse field of the components of the noise fields inside the space volume along the second direction of the magnetic field in the space volume.

So each time the magnetic field in the space volume is displaced angularly for a certain angular displacement, also the compensation field of the noise fields inside the space volume is displaced angularly for the same angular displacement and also the probe is displaced angularly in order to has an angular displacement of the measuring direction of the probe which is equal to the one of the magnetic field in the space volume.

Advantageously this method allows to use a probe which is capable of measuring the magnetic field along only one measurement direction.

As a further advantage of this embodiment, having the probe a fixed orientation with respect to the magnetic field in the space volume, the local magnetic field for at least partly compensating for the strength of the magnetic field existing or generated in the space volume on the probe has to be determined only once and has not to be changed each time the direction of the magnetic field in the space volume is changed.

An alternative embodiment of the above methods steps provided when the magnetic field existing or generated in the space volume has a variable orientation in space comprises the steps of measuring the field along to fixed measurement directions which are orthogonal one with respect to the other and determining the strength of the magnetic compensation field of the noise field inside the space volume as the component of the inverse magnetic field of the noise field inside the space volume along the direction of the magnetic field inside the space volume.

This can be easily calculated by determining the angular position of the direction of the magnetic field inside the space volume with respect to the two orthogonal measurement directions of the noise fields by the probes and calculating the projections of these components on the direction of the magnetic field inside the space volume and then the inverse field components.

Considering that these steps are simple vector addition steps the above calculation can be carried out by simple trigonometric functions.

Similar steps apply for determining the strength of the local field for at least partly compensating the strength of the magnetic field existing or generated in the space volume on the probe.

In this case the local fields on each magnetic field sensing element having one of the two orthogonal directions of measurement consist is calculated as an inverse magnetic field having a direction anti-parallel to the component of the magnetic field at the corresponding sensing element along the measurement direction of the sensing element and having an absolute strength which is at least a part of the strength of the component of the magnetic field on the sensing element of the probe.

When the above method is applied to a space volume which is defined by a magnetic structure for generating a static magnetic field having a predetermined direction in the space volume and which magnetic structure is rotatable, then the components of the compensation field of the noise fields inside the space volume and the local fields for at least partially compensating the magnetic field effects on the sensing elements of the probe can be calculated as a function of the angle of rotation of the magnetic structure.

In this second embodiment of the present method where the probe has two sensing elements having orthogonal measurement directions which are stationary and a angularly displaceable magnetic field in the space volume it is possible to use stationary means for generating the compensation field of the noise fields in the space volume. N this case same arguments has to be applied for the calculation of the compensation field since the magnetic field inside the space volume will vary its direction with respect to the compensation field. Nevertheless according to a preferred embodiment the means for generating the compensation field of the noise fields inside the space volume are angularly displaceable together with and for the same angular displacement as the magnetic field inside the space volume or with the magnetic structure for generating this field.

The invention further relates to a probe for detecting noise fields in space volumes in which a predetermined magnetic field exists, which probe has a field sensitive element, and means for generating a field for locally compensating, i.e., near the sensitive element, for at least a part of the effect of the predetermined in-volume magnetic field on the sensitive element.

The field for locally compensating for the effects caused on the probe by the predetermined in-volume magnetic field may be generated by using a local magnet structure having permanent magnets or resistive magnets, or by generating a compensating current, which corresponds to the current generated in the probe by the predetermined in-volume magnetic field.

The means for generating the compensation field to compensate for the effects of the predetermined in-volume magnetic field on the probe may be integrated in the probe or may be separate local field generating means, associated to the probe.

According to a further feature of the present invention the probe may be provided with at least two sensing elements each one being capable to measuring the magnetic field along only one direction of measurement, the at least two sensing elements being oriented one with respect to the other so that the corresponding directions of measurements are oriented non parallel one with respect to the other, preferably orthogonally one with respect to the other.

The invention further relates to a device which has at least one noise field probe according to the invention and which probe operates with the method according to the invention.

This device for compensating for noise fields in a space volume, in which a predetermined magnetic field exists, comprises:

at least one noise field probe, which is placed outside a space volume;

a computing unit for determining the magnetic fields inside the space volume, on the basis of probe data and of empirically defined or theoretically electrodynamics-based calculation or correlation functions.

a unit for generating the compensation fields for the noise fields inside the space volume.

In accordance with the invention, at least some of the probes have means for at least partly locally compensating, at least at some or at each of the probes, for the effects of the predetermined in-volume magnetic field on at least one or all of the probes.

Particularly, the device may have a single probe outside the space volume, which is connected to a single unit for computing the noise field inside the space volume and to a plurality of units for generating the compensation field/s.

According to a further improvement, the device may stably include more than one probe, each being dedicated to the detection of noise fields outside the space volume.

Another characteristic of the device consists in that the latter has at least two, three or more probes, placed outside the space volume in different locations, and each designed to detect the noise field outside the space volume at the different probe locations, an algorithm being loaded in the computation and correlation unit, for generating and solving a field describing system of equations, each equation consisting of the computation or correlation equation applied to the data detected by one of the at least two, three or more probes, which solution of the system of equations provides all the field describing variable parameters contained in the computation and correlation functions.

According to yet another improvement, the device is provided in combination with internal probes which measure the field inside the space volume, there being provided means for comparing the noise field/s inside the space volume which are obtained by a computation based on measured outside fields, and the fields inside the space volume which are measured by the internal probes, as well as means for manually changing the parameters of the computation and correlation functions to minimize the differences between the computed internal fields and the actually measured internal fields.

Advantageously, the probes situated inside the space volume are active probes, i.e., generate a predetermined test field, whose characteristics are well-known and predetermined in a no-noise condition, while the comparator receives the measurements of the inside test field and the nominal known values of the test field and there being provided means for manually changing the parameters of the computation and correlation functions to minimize the differences between the known test field data and actual test field measurement data.

As a further improvement of the use of the test field and of the probes for measuring it, a device is provided for exciting and detecting Magnetic Resonance echoes in a predetermined phantom.

This device includes means for generating a static field inside a predetermined volume, a coil for transmitting nuclear spin exciting pulses, a coil for receiving echoes from the nuclear spins, and a phantom having well-known response characteristics related to the Magnetic Resonance echoes, means for determining the frequency of the Magnetic Resonance echoes and means for comparing the Magnetic resonance echo frequency with the well-known frequency, means for changing the parameters of the computation or correlation function/s and/or of the compensation field generators, to minimize or neutralize the difference resulting from the comparator output.

Particularly, the frequency of Magnetic Resonance echoes is detected and compared with the well-known frequency, the parameters of the computation and correlation functions and/or compensation field generating currents being adjusted to neutralize or minimize this frequency difference.

The parameters of computation or correlation functions and/or of compensation field exciting current generation may be adjusted automatically by means of feedback units, which change the parameters of computation or correlation functions and/or the characteristics of the compensation field generating current on the basis of the difference signal resulting from the comparator.

A manual adjustment may be also made by using input means, through which controls may be input for changing the parameters of computation or correlation functions and/or compensation field generating currents.

According to an advantageous embodiment, the device has means for displaying the parameters or the curve of the test field and/or the outside noise fields and/or both theoretical or known and actual or measured inside fields, in alternate, overlapped and/or tiled form, graphic interface means of graphic input means through which controls are input, which change the aspect of the magnetic fields and/or the parameters thereof and means for unique association of a change to the parameters of computation and correlation functions and/or compensation field generating currents in response to the selected graphic changes.

It shall be noted that the means and units of the device may be units with a dedicated construction or computers, as well as small suitably programmed personal computers, having interfaces for connection with outside noise field and/or in-volume field measuring probes, and with the compensation field generating coils and/or with the test field generating and measuring devices, while the software for executing probe signal reading functions, computation and correlation functions to determine in-volume noise fields, compensation field generating current production functions, comparison functions, functions for automatic determination or manual setting of changes to the parameters of computation and correlation functions and/or to compensation field exciting current generation functions, as well as the software for displaying and controlling the alphanumeric and graphic manual data input is loaded in the computer or PC.

According to still another features of the present invention means are provided for generating a test field or for generating a static magnetic field inside the space volume having a predetermined strength and direction, which means are mounted in a rotatable way for displacing angularly the static magnetic field direction;

Means for generating a compensation field of the noise field inside the space volume which means are mounted rotatably together with the means for generating a test field or for generating a static magnetic field inside the space volume;

At least a probe for measuring the noise fields outside the space volume and which probe has a predetermined direction of measurement having a predetermined orientation relatively to the direction of the test field or of the static magnetic field inside the space volume;

And which probe is mounted rotatably together with the means for generating a test field or for generating a static magnetic field inside the space volume.

An alternative embodiment comprises means for generating a test field or for generating a static magnetic field inside the space volume having a predetermined strength and direction, which means are mounted in a rotatable way for displacing angularly the static magnetic field direction;

Means for generating a compensation field of the noise field inside the space volume which means are mounted rotatably together with the means for generating a test field or for generating a static magnetic field inside the space volume;

At least a probe which is mounted outside to the space volume and which is stationary and comprises at least two sensing elements each one being capable to measure the magnetic field along only one direction of measurement, the at least two sensing elements being oriented one with respect to the other so that the corresponding directions of measurements are oriented non parallel one with respect to the other, preferably orthogonally one with respect to the other.

Referring now to a particular application of the magnetic field compensation method, probe and device of this invention, the probe or device are provided in combination with a Magnetic Resonance imaging apparatus, the apparatus being situated in a delimited space, which forms the space volume wherein the noise fields are to be compensated for, and the Magnetic Resonance apparatus being possibly used as an internal probe for detecting the conditions of the magnetic field inside the space based on the changes made to a well-known static field.

The Magnetic Resonance imaging machine includes all the components of an active probe, i.e., means for generating a static test field, coils for transmitting exciting pulses, coils for receiving nuclear spin echoes, an electronic unit for processing the received nuclear spin echo signals and electronic units that can be programmed in such a manner as to execute the comparison between the static field characteristics derived from nuclear spin echo receiving signals and the known characteristics of the static field, by simply providing a test phantom and a difference signal output interface with the noise field compensation device.

Here, since Magnetic Resonance imaging apparatuses are provided with display means, the graphic processing and display section of the apparatus may be used to display the curve of the test magnetic field as obtained by actual measurement, and that associated to known and predetermined characteristics, and to make appropriate changes aimed at minimizing or neutralizing the differences between the actual test field and the test field having those known and predetermined characteristics, i.e., the nominal test field, the data of the changes being transmitted through a special transformation interface, which transforms them into control signals, to be transmitted to the noise field compensation device.

The invention also relates to a Magnetic Resonance imaging machine including a cavity for accommodating a body under examination or a part thereof, means for generating a static field which permeates the cavity, at least one exciting pulse transmitting coil, at least one nuclear spin echo receiving coil, at least one compensation coil and at least one gradient coil, and there being provided an electronic apparatus controlling unit to operate the transmitting coil, the compensation coil and the gradient coil/s and which receives nuclear spin echo signals from the receiving coil, processes them and displays the corresponding images.

According to this invention, an embodiment incorporates a noise field compensation device inside the cavity wherein the body under examination or a part thereof is accommodated, there being provided at least one probe for detecting the noise fields outside the cavity, means for determining the noise fields inside the cavity on the basis of external measurements by executing theoretically or empirically defined computation or correlation functions, means for generating compensation fields for compensating noise fields inside the cavity.

The above means may be separate units, different from the specific control and processing units of the Magnetic Resonance imaging apparatus, or some or all of them may be existing units of the Nuclear Magnetic imaging apparatus.

For instance, according to a first embodiment, the compensation field generator means are made of the compensation coil/s and/or by the gradient coil/s.

The use of gradient coils may be advantageous to compensate for noise fields which cause field in homogeneities within the imaging cavity of the Magnetic Resonance imaging apparatus. It shall be noted that this is indeed possible thanks to the fact that the compensation device is closely integrated in the Magnetic Resonance imaging apparatus. This close integration, whereby almost all the components of the compensation device, except the probes, are existing units of the Magnetic Resonance imaging apparatus, allows to operate and control even the gradient coils, with no expensive construction requirement, by setting the gradient field in such a manner as to compensate for any noise field-induced in homogeneity.

Also, when the apparatus has a programmable control and processing unit, all the means of the noise field compensation device are the electronic units of the Magnetic Resonance imaging apparatus, in combination with software for executing noise field and compensation field measurement and determination functions.

Particularly, the Magnetic Resonance imaging apparatus has an input for at least one probe, preferably for at least two, three or more probes for detecting fields outside the cavity of the apparatus itself, and units for interfacing these probes with the control and processing unit of the apparatus, while a program for executing the compensation procedure is loaded, which determines, by using preset computation and correlation functions, the inside noise fields and the compensation and/or gradient coil exciting current, to be superimposed on the currents for generating normal compensation and gradient fields to obtain noise field compensation fields.

As disclosed above regarding the method and device, the Magnetic Resonance imaging apparatus may include an interface for connection with one or more probes, which interface has means for controlling resistive magnets to generate local compensation fields, at the probe locations, to compensate for the effects on the probes of the magnetic field generated by the magnet structure of the Magnetic Resonance imaging apparatus.

Similarly, the apparatus may have individual hardware units or specific software programs loaded in the control and processing unit thereof, separate units for generating compensation fields for the in-cavity noise fields, for each frequency band of the at least two available frequency bands.

The invention also relates to a Magnetic Resonance imaging machine including a cavity for accommodating a body under examination or a part thereof, means for generating a static field which permeates the cavity;

a noise field compensation device inside the cavity wherein the body under examination or a part thereof is accommodated, there being provided at least one probe for detecting the noise fields outside the cavity, means for determining the noise fields inside the cavity on the basis of external measurements by executing theoretically or empirically defined computation or correlation functions, means for generating compensation fields for compensating noise fields inside the cavity;

the means for generating a static field which permeates the cavity, the means for generating compensation fields for compensating noise fields inside the cavity and the at least one probe for detecting the noise fields outside the cavity are mounted rotatable together and for the same angular displacement.

As an alternative embodiment the invention also relates to a Magnetic Resonance imaging machine including a cavity for accommodating a body under examination or a part thereof, means for generating a static field which permeates the cavity;

a noise field compensation device inside the cavity wherein the body under examination or a part thereof is accommodated, there being provided at least one probe for detecting the noise fields outside the cavity, means for determining the noise fields inside the cavity on the basis of external measurements by executing theoretically or empirically defined computation or correlation functions, means for generating compensation fields for compensating noise fields inside the cavity;

the means for generating a static field which permeates the cavity and the means for generating compensation fields for compensating noise fields inside the cavity are mounted rotatable together and for the same angular displacement.

and the at least one probe for detecting the noise fields outside the cavity is stationary and comprises two sensing elements each one being capable to measure the magnetic field along only one direction of measurement, the at least two sensing elements being oriented one with respect to the other so that the corresponding directions of measurements are oriented non parallel one with respect to the other, preferably orthogonally one with respect to the other The invention provides further improvements which will form the subject of the appended claims.

BRIEF DESCRIPTION OF THE DRAWINGS

The characteristics of the invention and the advantages derived therefrom will appear more clearly from the following description of a few non limiting embodiments, illustrated in the annexed drawings, in which:

FIGS. 4A and 4B illustrate in an analogous way as FIGS. 2A and 2B a simplified rotatable magnetic structure in combination with a stationary probe having to sensing elements capable of measuring components of the noise field along two directions which are orthogonal one with respect to the other.

FIG. 5 illustrates the relations between the static magnetic field in the cavity of the magnetic structure, the noise field and the compensation field of the noise field and of the measured components of the noise field.

FIGS. 6A and 6B and 7 illustrates similarly to FIGS. 4A, 4B and 5 the relation between the rotation of the magnetic structure and the effects of the static magnetic field on the probe and the corresponding local compensation field of these effects at the probe.

DETAILED DESCRIPTION OF THE PREFERRED EMBODIMENTS

Figure 1:
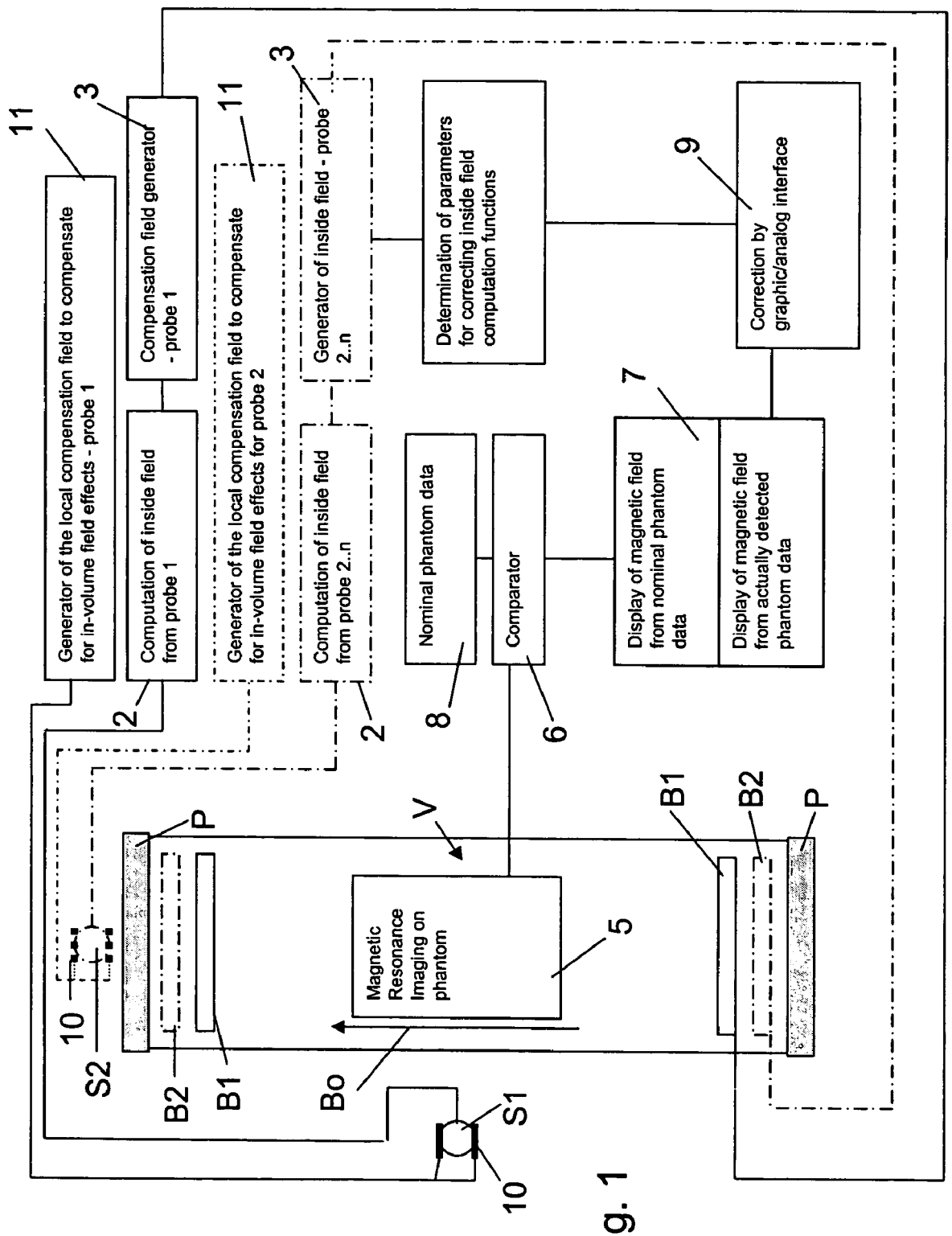
FIG. 1 shows a simplified block diagram of an embodiment of the inventive device, particularly of a Magnetic Resonance Imaging apparatus according to the invention.

Referring to FIG. 1, a device for compensating for magnetic noise fields in a space volume V, like the imaging volume of the cavity for receiving the patient or a part of the patient body, of a Magnetic Resonance Imaging apparatus, has at least one probe S1 for measuring noise fields, which is placed outside the space volume V.

The probe S1 may be of any type, such as a small Hall probe or a small coil, or the like. The probe S1 is connected to a processing and compensation field generator unit, which includes a unit for computing or correlating the values of the noise field inside the space volume V on the basis of the noise field values detected by the probe S1 outside the space volume V. This unit performs the calculation and/or correlation operations by using theoretical or empirical functions, i.e., deriving from the laws of electromagnetism and/or from experiments.

The computation or correlation unit 2 may be a hardware unit which permanently incorporates mathematical functions in its circuits, by using circuit components or units that are widely known and used to execute various mathematical operations on electric signals, or the unit advantageously consists of a programmable electronic unit, such as a microprocessor or the like associated to a storage unit and provided in combination with different software programs for the execution of several functional steps.

Then, the signal output from the unit 2, which corresponds to a value of the noise field inside the space volume V is used to generate a compensation field. To this end, the unit 2 controls, by this signal, a compensation field generator 3, which substantially consists of a power supply or generator, which operates one or more coils B1 for generating the compensation field inside the space volume V, which coils are located in this volume or in such a manner as to generate a compensation field which permeates this volume.

Again, the compensation field generator 3 may be a hardware board having a permanent construction, or a programmable and highly flexible unit. It shall be noted that these units, whose functions are described above, are widely used and known in the field of electronics and that those skilled in the art need only know the expected functional operations to easily determine the required components and the most appropriate selections, in response to specific needs.

The above device has a so-called open-loop structure, wherein the feedback loop is closed for compensation field control by application of the rule, i.e., the inside field computation function based on outside measurements. This structure is particularly advantageous when the space volume is the space in which magnetic field dependent measuring devices are accommodated, and the presence of probes may affect the operating conditions thereof.

Here, the outside location of the probe provides the greatest freedom in positioning the probe and in changing at will the number of probes in use.

Moreover, by using an open-loop arrangement, magnetic compensation fields may be continuously changed. This is advantageous, for instance, in Magnetic Resonance imaging apparatuses, wherein the compensation device may operate during the imaging step, and correct noise fields in real time, while the correction loop is not affected by the magnetic fields required for Magnetic Resonance imaging nor the latter is affected by the former.

However, the probe S1 and any further probe S2, Sn must be placed at a certain distance from the space volume V when a magnetic field exists in such volume, such as the static magnetic field Bo generated by the magnet structure of a Magnetic Resonance Imaging apparatus. The magnetic field Bo is generated between a pair of spaced pole pieces P, which delimit at least some of the sides of the patient cavity which forms the space volume V.

Such distance is often such as to require the probes to be placed outside the rooms which house the Magnetic Resonance Imaging apparatus and/or structures like chambers or the like which form Faraday cages for shielding the apparatuses from the outside environment. The longer the distance between the probes and the space volume V, the larger are the differences between the noise fields inside the space volume V, as determined on the basis of the values detected by the probes and this particularly when the probes are to be placed outside the above mentioned shields or Faraday cages.

On the other hand, probes cannot be placed below a certain distance from the space volume V, as the magnetic field existing in the space volume V causes probe saturation.

To this end, the invention provides means for at least partly compensating for the effects of the magnetic field in the space volume V at one or more probe locations. Such compensation is performed by locally generating, at probe location/s, a magnetic field opposed to that generated by the magnetic field in the space volume V. Obviously, the strength of the compensation fields depends on the distance of its respective probe from the space volume V. It is further obvious that no complete compensation may be achieved, as the opposed compensation field has in turn an effect on the magnetic field in the space volume V, which is not acceptable particularly in the case of a Magnetic Resonance Imaging apparatus. Furthermore, the means for generating the compensation field opposed to the field generated in the space volume V shall have a relatively small size, of the same order of magnitude as the probes.

Two embodiments are provided of the means for generating the magnetic field opposed to the magnetic field existing on the space volume V at the probe locations. In a first embodiment the compensation field generating means may be provided by permanent magnets. Alternatively, in a second embodiment, the means are provided by resistive magnets, in which an inductor is supplied with a predetermined current, corresponding to the compensation field to be generated. A combination of such means may be also envisaged, in which permanent magnets are provided for generating a starting compensation field and resistive magnets are provided for varying such compensation field as a function of probe distance.

The value of the magnetic field permeating the probe location outside the space volume depends on probe distance and the provision of permanent magnets as compensation field generating means requires the probe to be always positioned within a predetermined range of distances from the space volume V and/or from the magnet structure that generates the magnetic field Bo in the space volume V. Conversely, when a resistive magnet is provided, by varying the current, the compensation field may be also varied, and adapted to the effects generated by the magnetic field existing in the space volume V on the probe, as a function of the probe distance from such space volume V, or from the magnet structure that generates the magnetic field Bo in such space volume V.

By compensating for the magnetic field generated by the magnetic structure in the space volume V, at one probe location, the probe may be prevented from being driven into saturation, whereby the probes may be located considerably closer to the space volume V, i.e., to the magnet structure that generates the magnetic field Bo in the space volume V. This ensures a higher accuracy in the prediction of noise field parameters within the space volume V, based on measurements thereof by one or more probes.

Then, the data of the noise field inside the space volume V is transmitted to the means 3 that generate the compensation field exciting current.

The means 3 for generating compensation field may be separate for each probe S1, S2, Sn. As an alternative thereto, the signal output from the inside noise field calculation means 2 may be transmitted to control a common compensation field exciting current generator unit. In this case, the signal outputs from the computing means 3 associated to the probes S1, S2, Sn are combined to generate one compensation field exciting current.

The currents which generate the different compensation fields, output from separate generator means 3 may be supplied to a single compensation field generator coil; alternatively, each current may be used to feed individual coils B1, B2 for generating different compensation fields to compensate for noise fields in the space volume V as determined on the basis of the measurement signals from the probes S1, S2.

As an alternative to what is provided for the channels associated to the frequency bands 4 and 5, a combination may be also provided of the currents output from separate means 3 for generating compensation field exciting currents to operate a single common magnetic field excitation coil, in lieu of a combination of the signals output from the computing means to determine the noise field inside the space volume V.

Thanks to the use of programmable means, e.g., programmable filters, programmable calculating units and/or programmable exciting current generator units, the device provides a higher versatility, as compared with the configuration of special hardware units, each dedicated to a frequency band. This allows to adjust operational options, e.g., channel combinations, number of channels, etc. in as relatively inexpensive manner.

Referring to an additional characteristic, as shown in FIG. 1, a probe or a device 5 for detecting the inside magnetic field may be provided, as an improvement, in the space volume V. The detecting probe or device 5 is connected at its output to a comparator 6, which is in turn connected with display means 7. Data input means 8 are further provided, which may be alphanumeric keyboard means and/or graphic means for graphically changing the displayed data.

According to a first mode of operation, the detecting probe or device 5 inside the space volume V measure the actual noise field, and the latter is compared with the data of this field, resulting from a computation based on measurements of the outside magnetic field provided by the probes S1 and/or S2.

The comparator compares the two field curves and displays them on a screen, in overlapped and/or tiled and/or alternate positions, or displays the comparator output. In the latter case, the display means and the comparator allow to highlight the differences between the calculated inside noise field, and the actual field, and to automatically adjust the parameters of the computation functions, depending on the provision of one or more channels for the different frequency bands, so as to minimize or neutralize these differences and as to ensure that the compensation field exciting currents are generated on the basis of more accurate data on the noise field/s inside the space volume V.

The display provides a visual representation of the automatic correction progress and/or allows manual interventions on the adjustment of the computation function parameters by entering alphanumeric data through input means and/or by simply changing the graphic profile of the displayed field curve through graphic input means.

A unit for correlating graphic controls with the corresponding adjustments to computation function parameters, generates the controls to be transmitted to current generators for correcting the currents generated on the basis of computation means 2 or directly to computation means 2, to directly correct the parameters of the computation functions executed thereby.

Furthermore, in the figure, the means for generating the magnetic field opposed to the magnetic field Bo existing in the space volume V, at probe locations are provided by resistive magnets 10, that are controlled by power supply units 11 for these resistive magnets. Therefore, in this case, means may be also provided for displaying the operating conditions of the probes, as regards saturation thereof by the magnetic flux generated by the magnetic field Bo at probe locations. Thus, the local compensation field generating current may be adjusted to neutralize or at least partly reduce probe saturation effects, and probe distance may be also changed, while setting from time to time the appropriate local compensation field.

The above functions may be carried out by a processing unit, which consists of a microprocessor or a computer, whose central processing unit 10 controls the computing means 2, the exciting current generator means 3, the means 10 for generating local compensation fields in the probes, the display means 7, the comparator 6, which are all of the programmable type and constitute peripheral units of the central processing unit.

The architecture of the device as shown in FIG. 1 allows a higher expansibility and flexibility relative to the number of probes and channels, and/or to the methods for executing the steps of noise field detection and calculation, of actual condition detection and comparison and/or execution of the above control procedures.

The detection probe inside the space volume V is a device for detecting compensation conditions, operating on the basis of the changes to an active well-known static field, which is disposed inside the space volume V.

Here, there is no direct comparison between the inside noise fields determined from the measurements of the corresponding noise fields outside the space volume V, but the comparison is performed between the characteristics of the well-known static field as actually measured inside the space volume V and theoretically known characteristics.

Any type of device operating with the help of magnetic fields may be used for this purpose. Particularly, a suitable device for this purpose is a nuclear spin resonance echo detection device.

In this case, the device includes a so-called phantom, i.e., a test member having a known response to Magnetic Resonance stress. Inside the space volume V, the device 5 is used to excite and receive nuclear spin echoes from the phantom and to compare the data of the echoes with theoretical known data, which is stored in a suitable storage unit, as shown with numeral 8 in the figure.

From a first analysis, a simple comparison may be performed between the frequency of these detected nuclear spin echoes and theoretically expected frequency thereof.

Nevertheless, the curves of the actual static field Bo may be also determined from the received echo signals and compared with theoretical field. As described above, here again, the corrections to computation function parameters in computing means 2 and/or to compensating field generating currents may be determined by using either an automatic mode or a manual mode, by inputting alphanumeric data and/or graphic interventions, always with the purpose of minimizing or neutralizing the differences detected by the comparator.

The active static field device 5 may advantageously consist of a Magnetic Resonance imaging apparatus, which has the necessary means to excite, receive and process the nuclear spin echoes from a phantom and typically, in addition to the processing electronics, means for generating a static field, at least one coil for transmitting exciting pulses and at least a coil for receiving nuclear spin echoes. The combined use of a Magnetic Resonance imaging apparatus and a noise field compensation device may be particularly suitable to compensate for noise fields in apparatus installation rooms. As a rule, an apparatus is inserted in Faraday cages which are housed in special rooms, which cages form the space volume V that typically contains a Magnetic Resonance imaging apparatus.

This application is also advantageous for the fact that Magnetic Resonance imaging apparatuses generally have a programmable control and processing unit, which can accomplish some of the functions of the noise field compensation device, such as the functions of the computing means 2, passband filters 4, compensation field exciting current generator means 3, comparator means 6 as well as displays 7, storage units 8, and alphanumeric and/or graphic input means 9. Hence, the above mentioned combined use of Magnetic Resonance imaging apparatuses and noise field compensation devices allows to drastically reduce fabrication costs for the device, which are limited to the probes S1, S2.

The above description of the method and of the device according to the present invention is limited to a special case in which the space volume, particularly the cavity of an MRI scanner which is delimited by the magnetic structure of the MRI apparatus is stationary.

In the following case, the space volume or the direction in the space volume along which the magnetic noise fields has to be compensated is variable in space. An example of this case is represented by an MRI apparatus having a magnetic structure which delimits a cavity and which magnetic structure generates a static magnetic field having a predefined direction inside the cavity, the magnetic structure being further rotatable in such a way that the direction of the static magnetic field is varied corresponding to the angular displacement of the magnetic structure.

As already stressed out the rotation of the magnetic structure of an MRI apparatus has two consequences. Since the compensation of interest is the compensation of the magnetic noise field component parallel to the direction of the static magnetic field permeating the cavity of the MRI apparatus, the absolute value of this component varies as a function of the angle of rotation of the magnetic structure and thus of the direction of the static magnetic field. The noise fields outside the magnetic structure do not change their direction when the magnetic structure is rotated so that each time the magnetic structure is rotated a different strength of the compensation magnetic field of the noise field inside the magnetic structure has to be calculated by means of the measurements of the field by the probe or by the probes. As it will appear more clearly from the following description, this can be done by calculating the compensation field of the noise field inside the magnetic structure as a function of the measured noise field outside the magnetic structure and of the angle of rotation, i.e. the angular displacement of the magnetic structure from a first initial angular position to a second angular position. Dependency of the strength of the compensation field of the noise fields inside the magnetic structure are mere trigonometric functions which do not require a high computational burden. In any case these further steps have to be carried out since the compensation field of the noise fields inside the magnetic structure determined at the first angular position of the magnetic structure are not correct when the magnetic structure is in a different angular position.

A second effect relates to the local fields at the probes needed in order to compensate the effects of the static magnetic field generated by the magnetic structure at the locations of the probe in order to avoid saturation of the probes which would cause the probes not be able to measure the noise fields at their location.

Probes generally measure the magnetic field direction and strength along one component of the field which is parallel to a measurement direction implicitly defined by the probe structure and the kind of sensing elements provided in the probe. Considering a probe having a stationary, fixed position and orientation in space, when the aim is to compensate the local magnetic field at the probe location caused by the static magnetic field diffusing outside the magnetic structure, then it is clear that having the probe a intrinsically defined measurement direction so to be sensible only to the components of the magnetic fields along this measurement direction, a change in the direction of the static magnetic field generated by the magnetic structure will cause variable values of the strength of the static magnetic field diffused outside of the magnetic structure at the probe location which is a function of the angular displacement of the magnetic structure and thus of the static magnetic field direction. Also in this case the local compensation field of the static magnetic field diffused outside the space volume, i.e. outside the magnetic structure, is a function of the angular displacement of the static magnetic field direction and in this particular case also of the magnetic structure. This function is also in this case a pure trigonometric function.

The following FIGS. 2A to 8 illustrates in a simplified manner with greater detail the above problem and different embodiments of the suggested solutions according to the present invention.

Relatively to the illustrated and below described embodiments it has to be noticed that this embodiments are simplified in order to facilitate the comprehension of the problem and of the main general features of the solutions suggested by the present invention. Nevertheless it has do be stressed out that each of the embodiments can be provided in combination with one or more of the features of the method according to the present invention and with one or more of the features of the device according to the present invention, particularly also with one or more of the features of the device disclosed in FIG. 1 and in the relating description.

According to a first embodiment of the method and device of the present invention considering space volumes in which the compensation field of the noise fields has to be determined along a predefined direction which is variable. A particular embodiment is considered where a space volume consisting in the cavity V of a magnetic structure defined by the pole pieces P and which magnetic structure generates a static magnetic field Bo inside the space volume of the cavity V. The magnetic structure is rotatable along a horizontal axis passing through the point C. Only a probe S1 is illustrated for simplicity, which probe S1 is rigidly linked by supporting means 20 to the magnetic structure so to be rotated together with the magnetic structure and for the same angular displacement.

Figure 2A:
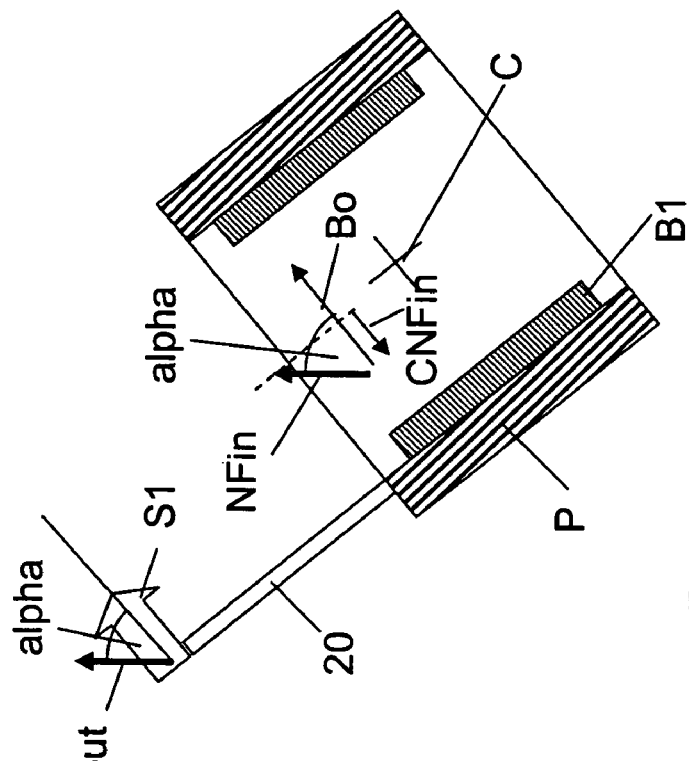
FIGS. 2A and 2B illustrates a simplified rotatable magnetic structure defining a cavity permeated by a magnetic field in two different angular positions and in combination with a probe being rigidly connected to the magnetic structure for rotating together with the magnetic structure.

In FIG. 2A the probe S1 and the magnetic structure represented by the pole pieces P are in oriented in such a way that the static magnetic field Bo permeating the space volume V and the direction of measurement of the probe S1 are parallel and vertical. The FIG. 2 illustrates the case in which both the magnetic structure and the probe have been rotated around the common axis passing through C in a second angular position for the same angular displacement corresponding to the angle indicated by alpha.

The measurement direction of the probe S1 is indicated by representing the probe S1 as an arrow, which arrow indicates the direction of measurement or the direction of the component of the noise field NFout which the probe measures. Arrow NFout indicates the noise field outside the space volume V. NF in indicates the field inside the space volume V and CNFin the compensation field of the noise field NF in inside the space volume V. The condition of FIG. 2A corresponds to the condition of operation of the device disclosed in FIG. 1 when the magnetic structure is a stationary one. B1 indicates the means for generating the compensation field CNF in of the noise field NF in inside the space volume.

Figure 2B:
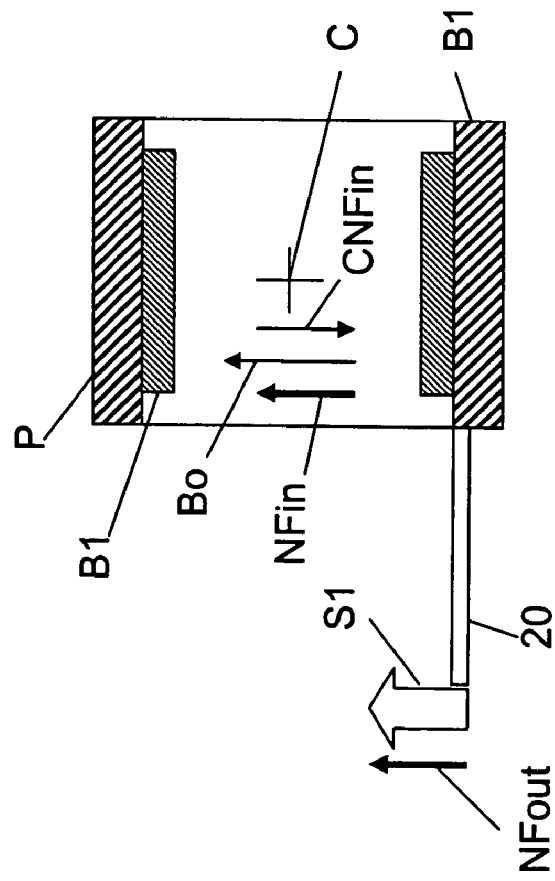

When the magnetic structure is rotated around C for an angle alpha the situation corresponds to the one of FIG. 2B. Here the rigid link 20 supporting the probe S1 and rigidly connection it to the magnetic structure determines that also the probe S1 is rotated together with the magnetic structure and for the same angular displacement of the angle alpha around the common axis passing through the centre of rotation C.

In this condition since the noise fields NF out has not changed their direction the probe S1 will measure the component of the noise fields along its direction of measurement which has changed for the angle alpha. Thus this component will have the direction of the measurement direction of the probe S1 which is the same as the one of the static magnetic field Bo in the space volume. The strength of the measured noise field at the probe S1 will correspond to the modulus or length of projection of the vector representing the noise field NF out at the probe on the measurement direction of the probe S1.

The same apply for the compensation field CNF in of the noise field NFin inside the space volume. As it appears evident form the vectors representing the compensation field CNFin of the noise field NFin inside the space volume for the two angular positions of the FIGS. 2A and 2B, the vector CNFin in FIG. 2B has a smaller modulus than the vector CNFin in FIG. 2A, correspondingly to the projection of the noise field NFin along the direction of the static magnetic field Bo. Thus when a rotating magnetic structure is provided the strength of the compensation field CNFin is also a function of the angular displacement or angular position of the magnetic structure and thus of the angular orientation of the static magnetic field.

Relating to the local compensation fields which ahs to be generated at the probe S1 for at least partially compensating the static magnetic field diffusing out of the magnetic structure and at the location of the probe S1, since no relative angular displacement takes place between the probe and the magnetic structure and thus between the direction of measurement of the probe and the static magnetic field Bo, the local compensation field to be generated at the probe S1 for avoiding saturation caused by the static magnetic field diffusing out of the magnetic structure remains the same for any angular position of the magnetic structure and thus for any angular orientation of the static magnetic field.

Relating to the compensation field CNFin of the noise field NFin inside the space volume, the dependency of the angular position of the magnetic structure and thus of the angular orientation of the static magnetic field Bo is automatically detected and taken into account by the probe S1, since the noise field NFout outside the magnetic structure or the space volume V measured by the probe S1 is already only the component of the noise field along the measuring direction of the probe S1 which is parallel to the static magnetic field Bo.

It has to be noted that the present case is a special case in which the probe is oriented in such a way relatively to the static magnetic field Bo that the measured component of the noise field is the one parallel to the static magnetic field Bo. This arrangement is advantageous but is not necessary since it is important that a fixed relation ship exists between direction of the component which the probe measures, i.e., the direction of measurement of the probe and direction of the static magnetic field Bo.

The relation can be easily taken into account in the computation of the noise field inside the space volume NFin from the values measured by the probe of the noise field at the probe and outside the space volume NFout as explained in the above description.

Figure 3:
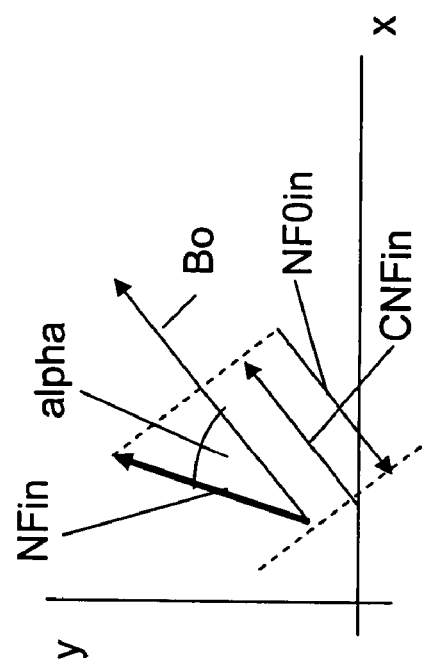
FIG. 3 is a diagram illustrating the relation of the static magnetic field in the cavity of the magnetic structure and of the noise field and of the compensation field of the noise field.

FIG. 3 illustrates with more detail the relation between the noise field NFin and the static magnetic field Bo by generalising the case of FIGS. 2A and 2B. hear the noise field outside the space volume and thus the noise field NFin inside the space volume has a certain direction which is not vertical and not parallel to the static magnetic field Bo in the space volume. By means of the angle alpha enclosed by the noise field in the space volume represented by the vector NFin and the vector Bo representing the static magnetic field in the space volume it is possible to determine the component of the noise field inside the space volume NF0in along the direction of the static magnetic field vector Bo and the inverse compensation field CNFin for compensating the component NFoin of the noise field along the static magnetic field.

Figure 8:
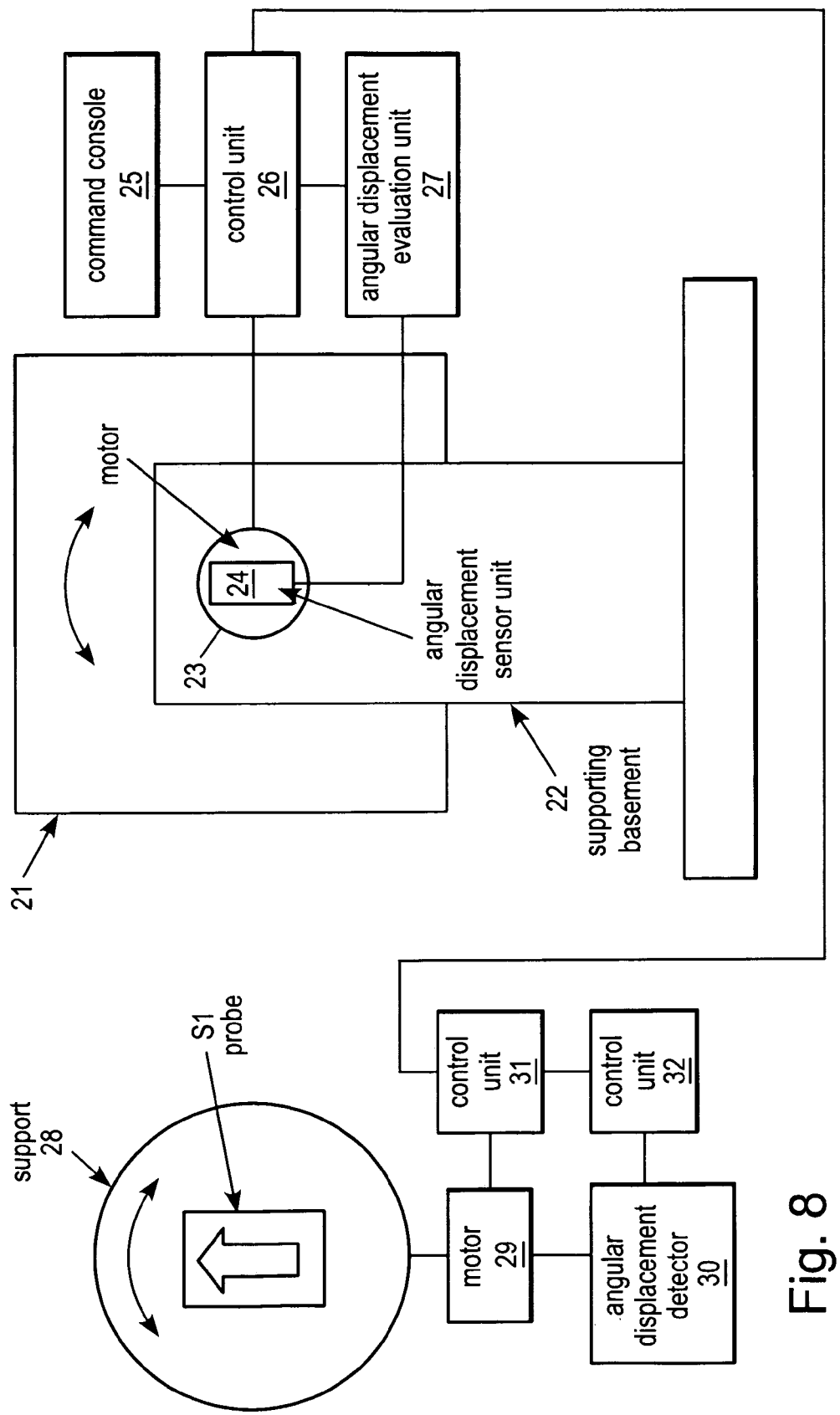
FIG. 8 illustrates an example of a rotatable magnetic structure and a probe which is rotatable along an axis of rotation parallel to the axis of rotation of the magnetic structure and which is rotated together or for the same angular displacement as the magnetic structure.

A variant of the embodiment according to FIGS. 2A and 2B is illustrated in FIG. 8. Here no mechanical rigid link is provided for connecting the probe S1 to the magnetic structure indicated by 21.

The magnetic structure 21 is mounted rotatably around a central axis which is oriented perpendicular to the sheet in a supporting basement 22. Rotation of the magnetic structure is caused by a motor 23 which can be of any kind, particularly non electric kind and especially a hydraulic motor 23. In the present example the motor is illustrated as a mere functional unit. Instead of a motor having a driven axis the rotation of the magnetic structure may be driven by an hydraulic linear actuator which is connected to radial arm of a shaft supporting the magnetic structure 21. The motor or drive unit is controlled relating to activation and deactivation by a control unit 26. Activation and deactivation command of the motor or driving unit 23 are given to the control unit 26 by means of a activation and deactivation command console 25. Means are provided for measuring the angular displacement or the angular position of the magnetic structure 21. This means indicated by an angular displacement sensor unit 24 communicating with an angular displacement evaluation unit 27 may be of any construction such as angular encoders and associated electronic units which reveals the angular displacement of the shaft or other similar devices. Particularly advantageous means for measuring the angular position or displacement of the scanner are electrical measuring means such as light emitter and receiver couples cooperating with a coded reflecting or transmitting disk which rotates together with the magnetic structure 21. The command console may be a very simple one having only an activation deactivation command commutators or may have means for inputting a desired angular displacement of the magnetic structure 21 which are considered by the control unit 26 of the motor or driving unit for automatically stopping the rotation of the magnetic structure when the angular displacement or the angular position corresponds to the selected or imputed one. As a further feature the activation/deactivation command console 25 may have means for indication the effective angular displacement of the magnetic structure and the effective angular position relatively to a predefined reference angular position and means for stopping manually the automatic control of the rotation of the magnetic structure if desired, for example in case of danger.

The activation/deactivation control unit 26 has an output for communication with an activation/deactivation control unit 31 of the probe assembly. This probe assembly comprises a probe S1 which is rotatably mounted on a support 28. A motor 29 causes the rotation of the probe S1. The probe is supported rotatably around an axis which is parallel to the axis of rotation of the magnetic structure. Furthermore a detector of the angular position or of the angular displacement 30 together with its specific control unit 32 is provided. The activation/deactivation control unit 31 of the rotation of the probe S1 communicates to the activation/deactivation control unit 26 of the rotation of the scanner by sending data relating to the current angular position of the probe S1 and the current angular displacement of the probe S1. Comparison of these data with the data relating to the current angular position and of the current angular displacement of the magnetic structure 21 carried out by the activation/deactivation control unit 26 or by a separate unit (not illustrated) provides that a certain relationship between the angular positions of the probe S1 and of the magnetic structure will be maintained everytime the magnetic structure 21 is rotated so to rotate the probe S1 for the same angular displacement of the magnetic structure. Thus a double contro of the rotation of the probe and of the magnetic structure is carried out by comparing the effective angular displacements and the absolute angular positions of the probe S1 and of the magnetic structure 21. The means 30, 32 for measuring the angular position and the angular displacement of the probe S1 may be constructed in a similar way as the ones 24, 27 of the magnetic structure 21. This applies also for the motor or driving unit causing the rotation of the probe S1.

Data can be transmitted form the activation/deactivation control unit 26 of the magnetic structure to the activation/deactivation control unit 31 of the probe assembly and vice versa by means of optical signals through optical guides.

The present embodiment of FIG. 8 allows very easily to add a further probe each time it is considered that this is necessary without having limitations relatively to the locations of the probes in the space around the magnetic structure 21 or the MRI scanner. Although no rigid link connecting the probes to the magnetic structure is necessary which is and advantage since due to rotation the magnetic structure would request a very large space around it which has to be maintained free and the rigid links between one or more probes and the magnetic structure could be a danger for the service persons and the patients.

FIGS. 4A to 7 illustrate in a similar manner as FIGS. 2A to 3 an alternative embodiment of the method and device according to the present invention when considering the case of a noise field compensation which is dependent form variable orientation and particularly of a MRI apparatus having a rotatable magnetic scanner causing the static magnetic field Bo to have different orientations.

Here it is considered to provide a probe assembly S1 having two magnetic field sensing elements 40 and 41.

The two magnetic field sensing elements 40 and 41 are oriented one with respect to the other in such a way as to measure components of the noise field outside the magnetic structure and at the probe assembly along different directions corresponding to the above already defined direction of measurement. Although there is non limitation in the relative orientation of the two measurement directions of the two sensing elements 40, 41, the special embodiment considering two sensing elements 40, 41 each one having a direction of measurement which is orthogonal to the direction of measurement of the other sensing element is the preferred one.

Although the case of FIGS. 4A to 7 considers a probe having only two sensing elements, it is possible also to provide for a probe assembly having three sensing elements each one oriented in such a way that the corresponding direction of measurement is different form the one of the other sensing elements and particularly is orthogonal to the direction of measurement of the other two sensing elements. This case could be advantageous when the probe cannot be oriented relatively to the rotatable scanner in such a way as illustrated in FIGS. 4A, 4B and 6A, 6B where the directions of measurement of the two sensing elements are contained in a plane perpendicular to the axis of rotation of the magnetic structure and thus of the direction of the static magnetic field Bo.

The probe assembly S1 of the embodiment according to FIG. 4A to 7 is placed outside the magnetic structure at a predefined distance according to the method steps disclosed with reference to the embodiment of FIG. 1. In contrast to the embodiment of FIGS. 2A to 3 and 8, the probe assembly has a fixed position and orientation in space and does not vary its position when the magnetic structure or the static magnetic field Bo is rotated around the axis passing through the pint C and being perpendicular to the sheet as already described with reference to FIGS. 2a, 2B, 3 and 8.

Here the two sensing elements 40 and 41 of the probe assembly S1 measures the components of the noise field NFout outside the magnetic structure at the probe S1 along the two direction of measurement of the sensing element and which components are indicated with the reference NFout1 and NFout2. In the FIGS. 4A to 7 the noise field outside the magnetic structure and at the probe is represented by a vector NFout having an orientation which is not parallel to the first orientation of the static magnetic field Bo in order to represent a more generic case. As it appears evident the relevant component of the noise field which has to be compensated is the one which is parallel to the static magnetic field Bo. In FIG. 4A it is chosen that the sensing element 41 has a direction of measurement which is parallel to the static magnetic field Bo so that the relevant component of the noise field to be compensated is the one along the direction of measurement of the sensing element 41 being indicated as the vector NFout2 at the probe S1 and as the vector NFin2 inside the space volume V.

When the magnetic structure is rotated from the angular position of FIG. 4A to the angular position of FIG. 4B, the situation changes. The static magnetic field Bo varies its orientation in space for correspondingly to the angular displacement of the magnetic structure represented by the pole pieces P.

Also the means for generating the compensation magnetic field for compensation the noise field inside the space volume rotates together and for the same angular displacement of the magnetic structure and of the static magnetic field Bo as described already with reference to the example of FIGS. 2A to 3. The probe S1 does not change position and particularly its angular position. Also the noise field does not change its direction as indicated by the vector NFout and NFin in FIG. 4B.

As it appears evident, since the noise field component inside the space volume which has to be compensated is the one parallel to the direction of the static magnetic field, due to the rotation of the magnetic structure and to the corresponding change in orientation of the static magnetic field relatively to the noise field outside and inside the space volume the strength of the inside noise field NFin to be compensated has changed as a function of the angular displacement of the magnetic structure and thus of the static magnetic field. FIG. 4B illustrate the compensation field CNFin of the inside noise field as a vector having the modulus corresponding to the modulus of the projection of the magnetic noise field NFin inside the space volume on the vector representing the static magnetic field Bo and having opposite direction. The relation between the magnetic noise field NFin and the component of it along the static magnetic field Bo and thus the compensation field CNFin of the noise field inside the space volume is a function of the angle alpha between the noise field NFin inside the space volume V and the static magnetic field Bo which is a simple trigonometric function.

This relation and the computation of the component of the noise field NFin inside the space volume along the direction of the static magnetic field Bo can be computed by using the components NFout1 and NFout2 of the magnetic noise field NFout outside the space volume and at the sensing elements of the probes and the angular relations, namely the angles between the components NFout1 and NFout2 or the corresponding direction of measurement of the sensing elements 40, 41 and the direction of the static magnetic field Bo.

This is explained by means of the graphical representation of FIG. 5.

Here the right side of FIG. 5 represents in the x-y plane the noise field NFin, its components NFin1 and NFin2 along the x and y axis which are considered to represent the two direction of measurements of the sensing elements 40, 41 of the probe assembly S1 and the compensation field CNFin determined as the inverse vector of projection of the inside noise field NFin on the vector representing the static magnetic field Bo.

The right side of FIG. 5 indicates how the compensation field represented by the vector CNFin can be determined by the addition of the projection of the components NFin1 and NFin2 of the noise field NFin along the direction of the static magnetic field represented by the vector Bo.

The graphic explanation makes clear to the expert in the art that these way of determining the compensation field CNFin is a mere trigonometric function describing the relation between the components NFin1 and NFin2 of the noise field NFin inside the space volume and the static magnetic field Bo, the argument of the function being the angle between the direction of the static magnetic field Bo and the components NFin1 and NFin2. The functional relation can be provided in the function for determining the noise field components NFin1 and NFin2 from the measurement of the corresponding components NFout1 and NFout2 of the two sensing elements 40, 41 of the probe assembly S1 by providing the measurement of the direction of the static magnetic field or of the angular position or displacement of the magnetic structure.

FIGS. 6A, 6B and 7 are similar to FIGS. 4A, 4B and 5 with the difference that here the effect of the rotation of the magnetic structure and thus of the change of the direction of the static magnetic field Bo on the local field for compensating the static magnetic field Bo diffusing out of the space volume at the location of the probe assembly S1.

FIG. 6A illustrates the case in which the magnetic structure represented by the pole pieces P has an angular position in which the static magnetic field Bo in the space volume V is vertical and parallel to the direction of measurement of the sensing element 41 of the probe assembly S1. The local field LF at the probe assembly deriving form the static magnetic field Bo diffusing out of the space volume V is thus parallel to the direction of measurement of the sensing element 41 of the probe assembly. Local compensating field generating means (not illustrated but of the line indicated with 10 in FIG. 1) generates a compensation field CLF which at least partially compensate at the probe assembly the local field LF as already disclosed in the previous description of the method according to the present invention. Here the component of the local field LF along the direction of measurement of the sensing element 41 is equal to the local field since both direction are parallel, while the component along the measuring direction of the sensing element 40 is zero. When the magnetic structure is rotated as in FIG. 6B, while the probe assembly S1 remains stationary, the static magnetic field Bo changes its direction correspondingly to the angular displacement of the magnetic structure which generates this field. Thus as it appears clearly form FIG. 6B and from the graphical representation of FIG. 7 also the local field LF changes its direction accordingly to the static magnetic field Bo inside the space volume V. Thus the vector LF representing the local magnetic field at the probe assembly consisting in the static magnetic field diffusion outside the magnetic structure has the same orientation in space as the vector representing the static magnetic field Bo inside the space volume V.

In this condition each of the two sensing elements 40, 41 is subjected to the effects of the local magnetic field because this local magnetic field LF has a non zero component along the direction of measurement of each sensing element 40, 41 as indicated by the vectors LF1 and LF2. Thus at the probe assembly means for generating a compensation field CLF1 and CLF2 for each sensing element 40, 41 are provided. Also in this case the relation between the compensation fields CLF1 and CLF2 of the local magnetic field LF depends from the angular displacement or of the angular position of the magnetic structure and thus from the orientation of the static magnetic field Bo relatively to the orientation of the probe assembly S1 and particularly relatively to the directions of measurement of the two sensing elements 40, 41 and the function representing this dependency is a simple trigonometric function as it appears clearly from the figures.

Relating to the embodiment according to FIGS. 4A to 7, it has to be noted that similarly to the embodiment according to FIGS. 2A to 3 and 8, the features described with reference to FIGS. 4A to 7 can be provided in combination with one or more features of the method and of the device which has been disclosed with reference to the embodiment of FIG. 1 and generally to the case where there is no variation in the direction of the static magnetic field or of the direction in the space volume along which a compensation of the noise fields has to be carried out as far as these features or method steps can be applied to the present embodiment according to FIGS. 4A to 7.

Although only preferred embodiments are specifically illustrated and described herein, it will be appreciated that many modifications and variations of the present invention are possible in light of the above teachings and within the purview of the appended claims without departing from the spirit and intended scope of the invention.

The invention claimed is:

1. A method for compensating in a space volume for a magnetic noise field outside the space volume, the method comprising:
   determining a strength of the magnetic noise field outside the space volume, wherein determining the strength of the magnetic noise field outside the space volume includes determining a component of the noise field outside the space volume along a direction which is parallel or has a fixed orientation relative to a selected direction in the space volume along which a compensation is to be carried out;
   defining a correlation between the noise field outside the space volume and a corresponding noise field inside the space volume, or calculating the noise field inside the space volume on the basis of the determined strength of the magnetic noise field outside the space volume;
   determining a noise field component inside the space volume along the selected direction;
   compensating for the magnetic noise field outside the space volume by generating a compensation noise field component along the selected direction; and
   wherein the compensation noise field component inside the space volume along the selected direction is determined as a function of an angular position or of an angular displacement of the direction of compensation with respect to a direction of measurement of the magnetic noise field outside the space volume.

2. The method according to claim 1, further comprising:
   defining a variation of the selected direction along which the compensation of the noise field is to be carried out in the space volume from a first direction to a second direction; and
   determining the component of the noise field inside the space volume along the second direction from the determined component of the noise field outside of the space volume or from the component of the noise field inside the space volume along the first direction as a function of the angular displacement from the first to the second direction.

3. The method according to claim 1, wherein the selected direction along which a compensation field of the noise field has to be carried out is defined by a static magnetic field existing or generated in the space volume, the selected direction of the static magnetic field being variable.

4. The method according to claim 1, wherein a component of the noise field along a certain direction in the space volume is determined by measuring components of the noise field outside the space volume along two different directions of measurement and determining the component of the noise field inside the space volume along the certain direction of compensation as a function of the angle of the direction of compensation with the components of the noise field along the two directions of measurement.

5. The method according to claim 4, wherein the direction and strength of the noise field outside the space volume is determined by means of the measured components of the noise field outside the space volume by vector addition, while the strength of the component of the noise field outside of the space volume or inside of the space volume is determined also as the projection of the noise field on the direction of compensation.

6. The method according to claim 4, wherein the direction along which the compensation field of the noise field has to be carried out is defined by a static magnetic field existing or generated in the space volume, the direction of the static magnetic field being variable.

7. The method according to claim 1, wherein the method further comprises generating, at least at some or at each of the noise field detection locations, a local magnetic field for at least partly compensating for the effect of a predetermined magnetic field Bo, in the space volume.

8. The method as claimed in claim 7, wherein the method further includes the arrangement of one or more probes at given distances from the space volume in which noise fields are to be determined and a magnetic field of a predetermined strength exists, the graphic display of the measuring signal from one or more probes with reference to the measuring range thereof, the control of the compensation field current, designed to compensate for the effects of the magnetic field existing in the space volume on the probes, the current being determined of such a strength as to be able to reduce the signal detected by the probes and generated by the magnetic field in the space volume below about 50% of the probe saturation value.

9. The method according to claim 7, wherein the local magnetic field for at least partly compensating for the effects of the predetermined magnetic field Bo, in the space volume diffusing at the location of measurement of the noise field is determined as a component of the static magnetic field Bo diffusing out of the space volume along at least one direction of measurement of at least one component of the magnetic noise field.

10. The method according to claim 9, wherein the local magnetic field for at least partly compensating for the effects of the of the predetermined magnetic field Bo, in the space volume diffusing at the location of measurement of the noise field is determined as the component of the static magnetic field Bo diffusing out of the space volume along two different direction of measurement of two components of the magnetic noise field.

11. The method according to claim 10, wherein the two directions of measurement of two components of the noise field and of the components of the static magnetic field diffusing out of the space volume at the location of the measurement are orthogonal one with respect to the other.

12. The method as claimed in claim 7, wherein the local field designed to compensate for the effect of the predetermined magnetic field Bo existing in the space volume has 50% the strength of the magnetic field Bo, at the probe locations in which saturation of probe signal would occur.

13. The method as claimed in claim 7, wherein the local magnetic fields designed to compensate for the effect of the predetermined magnetic field Bo existing in the space volume at noise field detection locations may be generated by permanent magnets or resistive magnets, which are located at the probe or noise field detection locations.

14. The method as claimed in claim 7, wherein the method further includes the arrangement of one or more probes at given distances from the space volume in which noise fields are to be determined and a magnetic field of a predetermined strength exists, the graphic display of the measuring signal from one or more probes with reference to the measuring range thereof, the control of the compensation field current, designed to compensate for the effects of the magnetic field existing in the space volume on the probes, the current being determined of such a strength as to be able to reduce the signal detected by the probes and generated by the magnetic field in the space volume below a predetermined threshold.

15. A device for compensating for magnetic noise fields in a space volume and for implementing the method as claimed in claim 1 which includes:
at least one noise field probe which is placed outside a space volume;
at least one unit for determining magnetic fields inside the space volume, on the basis of data detected by the probe and/or of empirically defined and/or electrodynamics-based computation or correlation functions;
at least one unit for generating a magnetic compensation field component for the noise fields inside the space volume wherein the magnetic compensation field component inside the space volume is determined as a function of an angular position or of an angular displacement of the direction of compensation with respect to a direction of measurement of the magnetic noise field outside the space volume, and
means for generating, at least at one, at some or at each of the probe locations, a local magnetic field for at least partly compensating for the effect of the predetermined magnetic field, in the space volume at the probes.

16. The device as claimed in claim 15, wherein at least one, or some or all of the probes contained therein comprise a field sensitive element, and means for generating a field for locally compensating near the sensitive element, for at least a part of the predetermined magnetic field at the sensitive element.

17. The device as claimed in claim 15, wherein the device includes an arrangement of one or more probes at given distances from the space volume in which noise fields are to be determined and a magnetic field of a predetermined strength exists, means for graphic display of the measuring signal from one or more probes with reference to the measuring range thereof, means for controlling the compensation field current, designed to compensate for the effects of the magnetic field existing in the space volume on the probes, the current being determined of such a strength as to be able to reduce the signal detected by the probes and generated by the magnetic field in the space volume below a predetermined threshold to about 50% of the probe saturation value.

18. The device as claimed in claim 15, wherein the device has a single probe outside the space volume, which is connected to a single computing unit for determining the noise field inside the space volume and to a single unit for generating the compensation field.

19. The device as claimed in claim 15, wherein the device has multiple permanent probes, each dedicated to the detection of noise fields outside the space volume, a unit for computation or correlation of inside noise fields for each probe and a unit for generating the magnetic field designed to compensate for the noise fields in the space volume for each probe.

20. The device as claimed in claim 15, wherein the device has at least two or more probes, positioned outside the space volume in different locations, and each of which probes is designed to detect the noise field outside the space volume at each probe location, an algorithm being loaded in a computation and correlation unit, for generating and solving a field describing system of equations, each equation comprising the computation or correlation function and of a noise field describing function applied to the data detected by one of the at least two, three or more probes, which solution of the system of equations provides all variable noise field describing parameters.

21. The device as claimed in claim 20, wherein the device includes a programmable processing unit containing the programs for solving the systems of equations.

22. The device as claimed in claim 20, wherein the device includes a number of measuring probes which corresponds to a number of independent variable parameters of the noise field describing function.

23. The device as claimed in claim 15, wherein the device has at least one probe or device which measures the field inside the space volume, means for comparing the noise fields inside the space volume which are obtained by a calculation based on measured outside fields, and the fields inside the space volume which are measured by the internal probes or device, and a means for manually adjusting the parameters of the calculation and correlation functions and/or of compensation fields, to minimize the differences between the calculated inside fields and the actually measured inside fields.

24. The device as claimed in claim 23, wherein the probes or devices situated inside the space volume are active probes or devices that generate a predetermined test field, whose characteristics are well-known and predetermined in a no-noise condition, while the means for comparing receives the measurements of the test field inside the space volume and the nominal known values of the test field and there being provided means for manually adjusting the parameters of the computation, correlation, noise field description and compensation field generation functions to minimize or neutralize the differences between the known test field data and actual test field measurement data.

25. The device as claimed in claim 24, wherein a graphic processing and display section of the Magnetic Resonance imaging apparatus is used as a graphic processing and display unit to display a curve of the test magnetic field as obtained by actual measurement, and that associated to known and predetermined characteristics, and to make appropriate adjustments aimed at minimizing or neutralizing the differences between the actual test field and the test field having those known and predetermined characteristics of the nominal test field.

26. The device as claimed in claim 23, wherein the device which measures the field inside the space volume is a device for exciting and detecting Magnetic Resonance echoes in a predetermined phantom.

27. The device as claimed in claim 26, wherein the device for measuring the field inside the space volume includes means for generating a static field inside a predetermined volume, a coil for transmitting nuclear spin exciting pulses, a coil for receiving echoes from the nuclear spins, and a phantom having well-known response characteristics related to the Magnetic Resonance echoes, means for determining the frequency of the Magnetic Resonance echoes and means for comparing the Magnetic resonance echo frequency with the well-known frequency, means for adjusting the parameters of the computation or correlation functions and/or of noise field describing functions and/or of the compensation field generators, to minimize or neutralize the difference resulting from the comparator output.

28. The device as claimed in claim 15, further including means for processing the current static field characteristics from the received echo signals, current data being compared with well-known nominal data in the comparator.

29. The device as claimed in claim 15, further including means for automatically making adjustments to the parameters of computation or correlation functions and/or of compensation field exciting current generation, consisting of a feedback unit, which adjusts the parameters of calculation or correlation functions and/or the noise field describing function, and/or the characteristics of the compensation field generating current on the basis of the difference signal resulting from the comparator and with the purpose of minimizing or neutralizing the differences.

30. The device as claimed in claim 15, wherein manual adjustment means are alternatively or jointly provided that control input means for adjusting the parameters of the computation or correlation functions and/or the compensation field generating currents.

31. The device as claimed in claim 15, further including means for displaying the parameters or the curve of the test field and/or the outside noise fields and/or both theoretical or known and actual or measured inside fields, which means display the data in alternate, overlapped and/or tiled form, graphic interface means of graphic input means through which controls are input, which change the aspect of the magnetic fields and/or the parameters thereof and means for univocal association of an adjustment to the parameters of the computation and correlation functions and/or to the compensation field generating currents in response to the selected graphic changes.

32. The device as claimed in claim 15, wherein the device is provided in combination with a Magnetic Resonance imaging apparatus, which is contained in a delimited space, that forms the space volume, wherein the noise fields are to be compensated for, at least some of the operating units of the Magnetic Resonance apparatus being used to execute at least some of the functions of the device as claimed in claim 15, in combination with control programs, that may be loaded in the control and processing unit of the Magnetic Resonance imaging apparatus.

33. The device as claimed in claim 15, wherein a Magnetic Resonance apparatus is used as an internal probe for detecting the conditions of the magnetic field inside the space based on the changes made to a well-known static field.

34. A Magnetic Resonance imaging apparatus which has a cavity for accommodating a body under examination or a part thereof, wherein the apparatus is integral with the device for compensating for noise fields in the cavity as claimed in claim 15.

35. The apparatus as claimed in claim 34, wherein the device for compensating for noise fields inside the cavity which accommodates the body under examination or the part thereof has characteristics as claimed in claim 34.

36. The Magnetic Resonance imaging apparatus as claimed in claim 34, wherein the apparatus has means for generating a static field permeating the cavity, at least one exciting pulse transmitting coil, at least one nuclear spin echo receiving coil, at least one static field compensation coil and at least one gradient coil, and there being provided an electronic apparatus controlling unit to operate the transmitting coil, the compensation coil and the gradient coil/s and which receives nuclear spin echo signals from the receiving coil, processes them and displays the corresponding images, which apparatus has, integrated therewith, a device for compensating for noise fields inside the cavity which accommodates the body under examination or a part thereof, there being provided at least one probe for detecting the noise fields inside the cavity, means for determining the noise fields inside the cavity on the basis of outside measurements, by theoretically or empirically defined computation or correlation or noise field describing functions, means for generating compensation fields for the noise fields inside the cavity.

37. The apparatus as claimed in claim 36, wherein the means for determining the noise fields inside the cavity on the basis of outside measurements, by theoretically or empirically defined computation or correlation or noise field describing functions, and the means for generating compensation fields for the noise fields inside the cavity are separate units, different from the specific control and processing units of the Magnetic Resonance imaging apparatus, or some or all of them are existing units of the Nuclear Magnetic imaging apparatus, in combination with specific control programs to operate the units of the Magnetic Resonance imaging apparatus, like the means for determining the noise fields inside the cavity and/or the means for generating compensation fields for the noise fields inside the cavity.

38. The apparatus as claimed in claim 37, wherein the compensation field generator means include the compensation coils and/or the gradient coils.

39. A Magnetic Image Resonance Imaging apparatus comprising a space volume and the device according to claim 15.

40. The device as claimed in claim 15, wherein the noise field probe comprises a field sensitive element, and means for generating a magnetic field for locally compensating for the noise fields near the sensitive element created by the predetermined magnetic field at the sensitive element.

41. The device as claimed in claim 40, wherein the noise field probe includes a magnet structure with permanent magnets as a generator of fields for locally compensating in the area of the sensitive element of the probe, for at least a part of an effect of the predetermined magnetic field at the sensitive element.

42. The device as claimed in claim 41, wherein the noise field probe includes one or more resistive magnets, together with one or more resistive magnet exciting current sources, as a generator of fields for locally compensating in the area of the sensitive element of the probe, for at least a part of the effect of the predetermined magnetic field at the sensitive element.

43. The device as claimed in claim 42, wherein the noise field probe includes means for graphic display of the detected signal, means for controlling the excitation current for the resistive magnets designed to generate the local magnetic compensation field to compensate for the effects of the magnetic field existing in the space volume at the sensitive element of the probe, means for setting a maximum threshold for the signal detected by the sensitive element of the probe, which maximum threshold determines the strength of the resistive magnet exciting current.

44. The device as claimed in claim 40, wherein the noise field probe includes a combination of permanent magnets and resistive magnets as a generator of fields for locally compensating in the area of the sensitive element of the probe, for at least a part of the effect of the predetermined magnetic field at the sensitive element.

45. The device according to claim 40, wherein the noise field probe comprises two sensing elements each of which is oriented in such a way as to measure a magnetic field component along a certain direction of measurement, the directions of measurement of the two sensing elements being not parallel.

46. The device according to claim 45, wherein the means for generating a local magnetic compensation field generates a local compensation field along each one of the two directions of measurement of the two sensing elements.

47. The method as claimed in claim 1, wherein the method includes combined or alternative steps of determining functions for correlation between the noise field outside the space volume and the noise field inside the space volume, or functions for computation of the inside noise field based on the measurements of the outside noise fields and/or of determining the noise field describing functions and/or of determining compensation fields by control measurements of the magnetic field inside the space volume.

48. The method as claimed in claim 47, wherein the method includes measuring the noise field inside the space volume, comparing the measured inside noise field with that determined on the basis of the measurements of the noise field outside the space volume, adjusting the variable parameters of the functions for calculating or describing the magnetic fields inside the space volume and/or the compensation fields, with the purpose of minimizing or neutralizing the differences as determined during the comparison.

49. The method as claimed in claim 48, wherein the method includes the generation of a known static test field inside the space volume, and detection of actual characteristics of the test field, comparing the characteristics with well-known characteristics of the static test field, adjusting the variable parameters of the inside field and/or compensation field to minimize or neutralize differences resulting from the comparison between the measured characteristics and the well-known characteristics of the static test field.

50. The method as claimed in claim 48, wherein the method includes the following steps:
generating a static magnetic field in the space volume, which magnetic field has such a strength and homogeneity as to be suitable for Magnetic Resonance imaging;
introducing a phantom in the static magnetic field, whose response to nuclear spin echo excitation is known;
exciting nuclear spin echoes in the phantom, by transmitting exciting pulses thereto;
receiving nuclear spin echoes from the phantom when fields are provided for compensating for the noise fields in the space volume;
comparing received data with well-known data or the characteristics of the static test field as determined from received signals with known characteristics;
adjusting the parameters of the functions that are used to calculate or correlate noise fields outside the space volume and noise fields inside the space volume, or the parameters of noise field or compensation field describing functions, on the basis of the differences resulting from the above comparison, and in such a manner as to neutralize or minimize the differences.

51. The method as claimed in claim 47, wherein an adjustment of the parameters of inside noise field and/or compensation field describing or calculating functions is determined manually, by alphanumeric data input and/or by controls designed to graphically change the comparison results, or automatically.

52. The method for compensating for noise fields in the space volume as claimed in claim 1, wherein the space volume is a room containing a Magnetic Resonance imaging apparatuses, wherein the method includes detection of noise fields outside the room containing the Magnetic Resonance imaging apparatus, and the use of the control and processing units of the Magnetic Resonance imaging apparatus to execute the procedures of reading measurements, and/or calculating in-volume noise fields and/or compensating for the effects of the static magnetic field of the apparatus on at least some of the probes and/or generating compensation field exciting currents to compensate for noise fields in the apparatus, there being provided one or more coils for generating compensation fields inside the room wherein the Magnetic Resonance imaging apparatus is located and programs for controlling control and processing units of the Magnetic Resonance imaging apparatus.

53. The method as claimed in claim 52, wherein the space volume wherein noise fields are compensated for, is the cavity which houses the body under examination, or a part thereof, of the Magnetic Resonance imaging apparatus.

54. The method as claimed in claim 52, wherein the Magnetic Resonance imaging apparatus is also a device for measuring magnetic fields in the space volume to execute the steps of:
determining the strength of the magnetic noise field outside the space volume;
defining the correlation between the noise field outside the space volume and the corresponding noise field inside the space volume, or calculating the noise field inside the space volume on the basis of the measurements of the magnetic field outside the space volume;
determining the noise field inside the space volume;
wherein the compensation of the magnetic noise field outside the space volume is carried out by determining the noise field component inside the space volume along the selected direction and generating the compensation field of the noise field component along the selected direction,
wherein the method includes the combined or alternative steps of determining the functions for correlation between the noise fields outside the space volume and the noise fields inside it, or the functions for computation of inside noise fields based on the measurements of the outside noise fields and/or of determining the noise field describing functions and/or of determining compensation fields by control measurements of magnetic fields inside the space volume.

55. The method according to claim 54, wherein the correlation between the noise field outside the space volume and the corresponding noise field inside the space volume is defined on a theoretical basis according to laws of electromagnetism.

56. The method according to claim 54, wherein the correlation between the noise field outside the space volume and the corresponding noise field inside the space volume is defined on an empirical basis.

57. A method for compensating in a space volume for a magnetic noise field outside the space volume, the method comprising:
a) generating a magnetic field inside the space volume which magnetic field has a first predefined direction in space;

b) providing a probe for measuring components of the magnetic noise field along a first measuring direction of the probe which has a predetermined direction relative to the first predefined direction of the magnetic field inside the space volume;

c) determining the strength of the components of the magnetic noise field outside the space volume along the measuring direction of the probe;

d) defining a correlation between the noise field outside the space volume and a noise field inside the space volume, or calculating the noise field inside the space volume on the basis of measurements of the magnetic noise field outside the space volume;

e) generating a magnetic compensation field inside the space volume which is an inverse field of components of the noise field inside the space volume along the first predefined direction of the magnetic field in the space volume;

f) varying the direction of the magnetic compensation field inside the space volume and the direction of measurement of the probe from the first direction to a second direction;

g) determining the strength of the component of the magnetic noise field outside the space volume along the second direction of the probe;

h) redefining the correlation between the noise field outside the space volume and the corresponding noise field inside the space volume, or calculating the noise field inside the space volume, on the basis of the measurements of the magnetic field outside the space volume;

i) generating the magnetic compensation field inside the space volume which is the inverse field of the components of the noise fields inside the space volume along the second direction of the magnetic field in the space volume; and j) repeating the above steps f) to i) for each variation of the direction of the magnetic compensation field inside the space volume.

58. The method according to claim 57, further comprising:

a1) generating a magnetic field inside a space volume which magnetic field has a first predefined direction in space;

b1) providing a probe for measuring components of the magnetic noise field along a first measuring direction of the probe which is parallel or has a predetermined direction relative to the first direction of the magnetic field inside the space volume;

c1) determining the strength of the components of the magnetic noise field outside the space volume along the measuring direction of the probe;

d1) defining, on a theoretical basis according to laws of electromagnetism or on an empirical basis, a correlation between the noise field outside the space volume and a noise field inside the space volume, or calculating the noise field inside the space volume, on the basis of the measurements of the magnetic noise field outside the space volume;

e1) generating a magnetic compensation field inside the space volume which is an inverse field of components of the noise field inside the space volume along the first direction of the magnetic field in the space volume;

f1) varying the direction of the magnetic compensation field inside the space volume and the direction of measurement of the probe from the first direction to a second direction;

g1) determining the strength of the component of the magnetic noise field outside the space volume along the second direction from the measured component of the noise field outside of the space volume and the angular displacement from the first direction to the second direction;

h1) generating a magnetic compensation field inside the space volume which is the inverse field of the components of the noise fields inside the space volume along the second direction of the magnetic field in the space volume; and repeating the above steps f1) to h1) for each variation of the direction of the compensation magnetic field inside the space volume.

59. The method according to claim 58, wherein the method comprises a combination of the steps g) to i) and g1) to h1), wherein the component of the noise field inside the space volume and along the second direction is determined by the steps g) to i) being compared with the component of the noise field inside the space volume along the second direction determined according to the steps g1 to h1); and the compensation field being determined as a function of the strength of the component of the noise field inside the space volume determined by means of the steps g) to i) and g1) to h1).

60. The method according to claim 57, wherein the first measuring direction of the probe is parallel to the first predefined direction of the magnetic field inside the space volume.

61. The method according to claim 57, wherein the correlation between the noise field outside the space volume and the corresponding noise field inside the space volume is defined on a theoretical basis according to laws of electromagnetism.

62. The method according to claim 57, wherein the correlation between the noise field outside the space volume and the corresponding noise field inside the space volume is defined on an empirical basis.

63. A method for compensating in a space volume for a magnetic noise field outside the space volume, the method comprising:

a) generating a magnetic field inside a space volume which magnetic field has a first predefined direction in space;

b) providing a probe for measuring components of the magnetic noise field along a first measuring direction of the probe which has a predetermined direction relative to the first direction of the magnetic field inside the space volume;

c) determining the strength of the components of the magnetic noise field outside the space volume along the measuring direction of the probe;

d) defining a correlation between the noise field outside the space volume and a noise field inside the space volume, or calculating the noise field inside the space volume, on the basis of the measurements of the magnetic noise field outside the space volume;

e) generating a magnetic compensation field inside the space volume which is an inverse field of components of the noise field inside the space volume along the first direction of the magnetic field in the space volume;

f) varying the direction of the magnetic compensation field inside the space volume and the direction of measurement of the probe from the first direction to a second direction;

g) determining the strength of the component of the magnetic noise field outside the space volume along the second direction as a function of the measured component of the noise field outside of the space volume and the angular displacement from the first direction to the second direction;

h) generating a magnetic compensation field inside the space volume which is the inverse field of the components of the noise fields inside the space volume along the second direction of the magnetic field in the space volume; and repeating the above steps f) to h) for each variation of the direction of the compensation magnetic field inside the space volume.

64. The method according to claim 63, wherein the first measuring direction of the probe is parallel to the first predefined direction of the magnetic field inside the space volume.

65. The method according to claim 63, wherein the correlation between the noise field outside the space volume and the corresponding noise field inside the space volume is defined on a theoretical basis according to laws of electromagnetism.

66. The method according to claim 63, wherein the correlation between the noise field outside the space volume and the corresponding noise field inside the space volume is defined on an empirical basis.

67. A method for compensating in a space volume for a magnetic noise field outside the space volume, the method comprising:

a) generating a static magnetic field inside a space volume which magnetic field has a first predefined direction in space;

b) providing a probe for measuring components of the magnetic noise field along two different directions of measurement having a predetermined orientation relative to the first direction of the magnetic field inside the space volume;

c) determining the strength of the components of the magnetic noise field outside the space volume along the two directions of measurement;

d) defining a correlation between the two measured components of the noise field outside the space volume and two components of the noise field inside the space volume, or calculating the two components of the noise field inside the space volume on the basis of measurements of the components of the magnetic noise field outside the space volume;

e) determining the noise field inside the space volume from the components of the noise field inside the space volume along the two directions of measurements as calculated at d);

f) determining the component of the noise field inside the space volume along the direction of the static magnetic field as a projection of the noise field inside the space volume determined at e) along the first predefined direction of the static magnetic field; and g) generating a magnetic compensation field inside the space volume which is the inverse field of the components of the noise fields inside the space volume along the first direction of the magnetic field in the space volume.

68. The method according to claim 67, further comprising:

h) varying for a certain angular displacement the direction of the magnetic field in the space volume from a first direction to a second direction;

i) determining the strength of the component of the magnetic noise field along the second direction of the static magnetic field as the projection of the noise field inside the space volume onto the second direction of the static magnetic field;

j) generating the magnetic compensation field inside the space volume which is the inverse field of the components of the noise fields inside the space volume along the second direction of the static magnetic field in the space volume;

k) repeating the above steps h) to j) for each variation of the direction of the static magnetic field inside the space volume.

69. The method according to claim 67, further comprising:

h) varying for a certain angular displacement the direction of the magnetic field in the space volume from a first direction to a second direction;

i) determining the strength of the component of the magnetic noise field along the second direction of the static magnetic field as a function of the component of the magnetic noise field along the first direction of the static magnetic field and of the angular displacement from the first to the second direction of the static magnetic field;

j) generating the magnetic compensation field inside the space volume which is the inverse field of the components of the noise fields inside the space volume along the second direction of the static magnetic field in the space volume;

k) repeating the above steps h) to j) for each variation of the direction of the static magnetic field inside the space volume.

70. The method according to claim 67, wherein the correlation between the two measured components of the noise field outside the space volume and two components of the noise field inside the space volume is defined on a theoretical basis according to laws of electromagnetism.

71. The method according to claim 67, wherein the correlation between the two measured components of the noise field outside the space volume and two components of the noise field inside the space volume is defined on an empirical basis.

72. The method according to claim 1, wherein the correlation between the noise field outside the space volume and the corresponding noise field inside the space volume is defined on a theoretical basis according to laws of electromagnetism.

73. The method according to claim 1, wherein the correlation between the noise field outside the space volume and the corresponding noise field inside the space volume is defined on an empirical basis.

74. A method for compensating in a space volume for a magnetic noise field outside the space volume, the method comprising:

determining a strength of the magnetic noise field outside the space volume;

defining a correlation between the noise field outside the space volume and a corresponding noise field inside the space volume, or calculating the noise field inside the space volume on the basis of the measurements of the magnetic field outside the space volume;

from the inside magnetic field generating a magnetic compensation field component for neutralizing the noise field in the space volume, wherein the magnetic compensation field component inside the space volume is determined as a function of an angular position or of an angular displacement of the direction of compensation with respect to a direction of measurement of the magnetic noise field outside the space volume;

wherein the method includes the steps of generating, at least at some or at each of the noise field detection locations, a local magnetic field for at least partly compensating for the effect of the predetermined magnetic field in the space volume.

75. The method as claimed in claim 74, wherein the local field designed to compensate for the effect of the predetermined magnetic field existing in the space volume has 50% the strength of the magnetic field, at the probe locations in which saturation of probe signal would occur.

76. The method as claimed in claim 74, wherein magnetic fields designed to compensate for the effect of the predetermined magnetic field existing in the space volume at noise field detection locations may be generated by permanent magnets or resistive magnets, which are located at the probe or noise field detection locations and/or are even integrated in the probes.

77. The method as claimed in claim 74, wherein it includes the arrangement of one or more probes at given distances from the space volume in which noise fields are to be determined and a magnetic field of a predetermined strength exists, the graphic display of the measuring signal from one or more probes with reference to the measuring range thereof, the control of the compensation field current, designed to compensate for the effects of the magnetic field existing in the space volume on the probes, the current being determined of such a strength as to be able to reduce the signal detected by the probes and generated by the magnetic field in the space volume below a predetermined threshold, particularly to about 50% the probe saturation value.

78. The method according to claim 77, wherein it includes the combined or alternative steps of determining the functions for correlation between the noise fields outside the space volume and the noise field/s inside it, or the functions for computation of inside noise fields based on the measurements of the outside noise fields and/or of determining the noise field describing functions and/or of determining compensation fields by control measurements of magnetic fields inside the space volume.

* * * * *